United States Patent
Kusumoto

(10) Patent No.: US 8,063,417 B2
(45) Date of Patent: *Nov. 22, 2011

(54) INTEGRATED CIRCUIT DEVICE AND METHOD FOR FORMING THE SAME

(75) Inventor: Keiichi Kusumoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/772,604

(22) Filed: May 3, 2010

(65) Prior Publication Data

US 2010/0244102 A1     Sep. 30, 2010

Related U.S. Application Data

(60) Division of application No. 12/271,501, filed on Nov. 14, 2008, now Pat. No. 7,737,473, which is a continuation of application No. 11/633,569, filed on Dec. 5, 2006, now Pat. No. 7,465,974, which is a division of application No. 10/879,754, filed on Jun. 30, 2004, now Pat. No. 7,155,684, which is a continuation of application No. 10/084,978, filed on Mar. 1, 2002, now Pat. No. 6,794,674.

(30) Foreign Application Priority Data

Mar. 5, 2001 (JP) ................................ 2001-060090

(51) Int. Cl.
    *H01L 27/10* (2006.01)
(52) U.S. Cl. .................. 257/207; 257/208; 257/E23.145
(58) Field of Classification Search .................. 257/207, 257/208, E23.145
    See application file for complete search history.

(56) References Cited

U.S. PATENT DOCUMENTS 5,119,169 A    6/1992    Kozono et al.
(Continued)

FOREIGN PATENT DOCUMENTS

JP    61-148834    7/1986
(Continued)

OTHER PUBLICATIONS

Japanese Notice of Reasons for Rejection, w/ English translation thereof, issued in Japanese Patent Application No. JP 2001-060090 dated Sep. 7, 2010.

*Primary Examiner* — Phat Cao

(74) *Attorney, Agent, or Firm* — McDermott Will & Emery LLP

(57) ABSTRACT

In an integrated circuit device, element power supply lines connected to a circuit containing a plurality of cells, element ground lines connected thereto, a trunk power supply line connected to each of the element power supply lines, and a trunk ground line connected to each of the element ground lines are provided in a first wiring layer. A branch power supply line connected to the trunk power supply line and a branch ground line connected to the trunk ground line are provided in an upper wiring layer located above the first wiring layer. A wiring structure is determined based on a wiring structure equation expressing the relations among a voltage drop in the lines, the area occupied thereby, and a current consumed thereby, and on a circuit characteristic equation expressing, when the circuit is subdivided while the ratio between the area of the circuit and a current consumed thereby is held constant, the relation between an area occupied by a circuit resulting from subdivision and a current consumed thereby.

30 Claims, 10 Drawing Sheets

U.S. PATENT DOCUMENTS

| | | |
|---|---|---|
| 5,285,018 A | 2/1994 | Pence, IV |
| 5,514,895 A | 5/1996 | Kikushima et al. |
| 5,663,677 A | 9/1997 | Freyman et al. |
| 5,723,908 A | 3/1998 | Fuchida et al. |
| 5,789,807 A | 8/1998 | Correale |
| 5,909,377 A | 6/1999 | Lin et al. |
| 5,969,420 A | 10/1999 | Kuge et al. |
| 6,097,043 A | 8/2000 | Igarashi et al. |
| 6,208,567 B1 | 3/2001 | Yamauchi et al. |
| 6,305,000 B1 | 10/2001 | Phan et al. |
| 6,306,745 B1 | 10/2001 | Chen et al. |
| 6,308,307 B1 | 10/2001 | Cano et al. |
| 6,489,689 B2 | 12/2002 | Nojiri |
| 6,560,762 B2 | 5/2003 | Kuwabara |
| 6,581,201 B2 | 6/2003 | Cano et al. |
| 6,635,515 B2 | 10/2003 | Okuaki |
| 6,657,307 B2 | 12/2003 | Iwamoto |
| 6,794,674 B2 * | 9/2004 | Kusumoto .................... 327/524 |
| 7,465,974 B2 * | 12/2008 | Kusumoto .................... 257/207 |
| 7,737,473 B2 * | 6/2010 | Kusumoto .................... 257/207 |
| 2001/0013790 A1 | 8/2001 | Kusumoto |
| 2002/0140001 A1 | 10/2002 | Komaki |
| 2002/0149116 A1 | 10/2002 | Kusumoto |

FOREIGN PATENT DOCUMENTS

| | | |
|---|---|---|
| JP | 62-084533 | 4/1987 |
| JP | 04-196475 | 7/1992 |
| JP | 06-021224 | 1/1994 |
| JP | 06-208994 | 7/1994 |
| JP | 07-078877 | 3/1995 |
| JP | 8-321551 | 12/1996 |
| JP | 2000-277696 | 10/2000 |

* cited by examiner

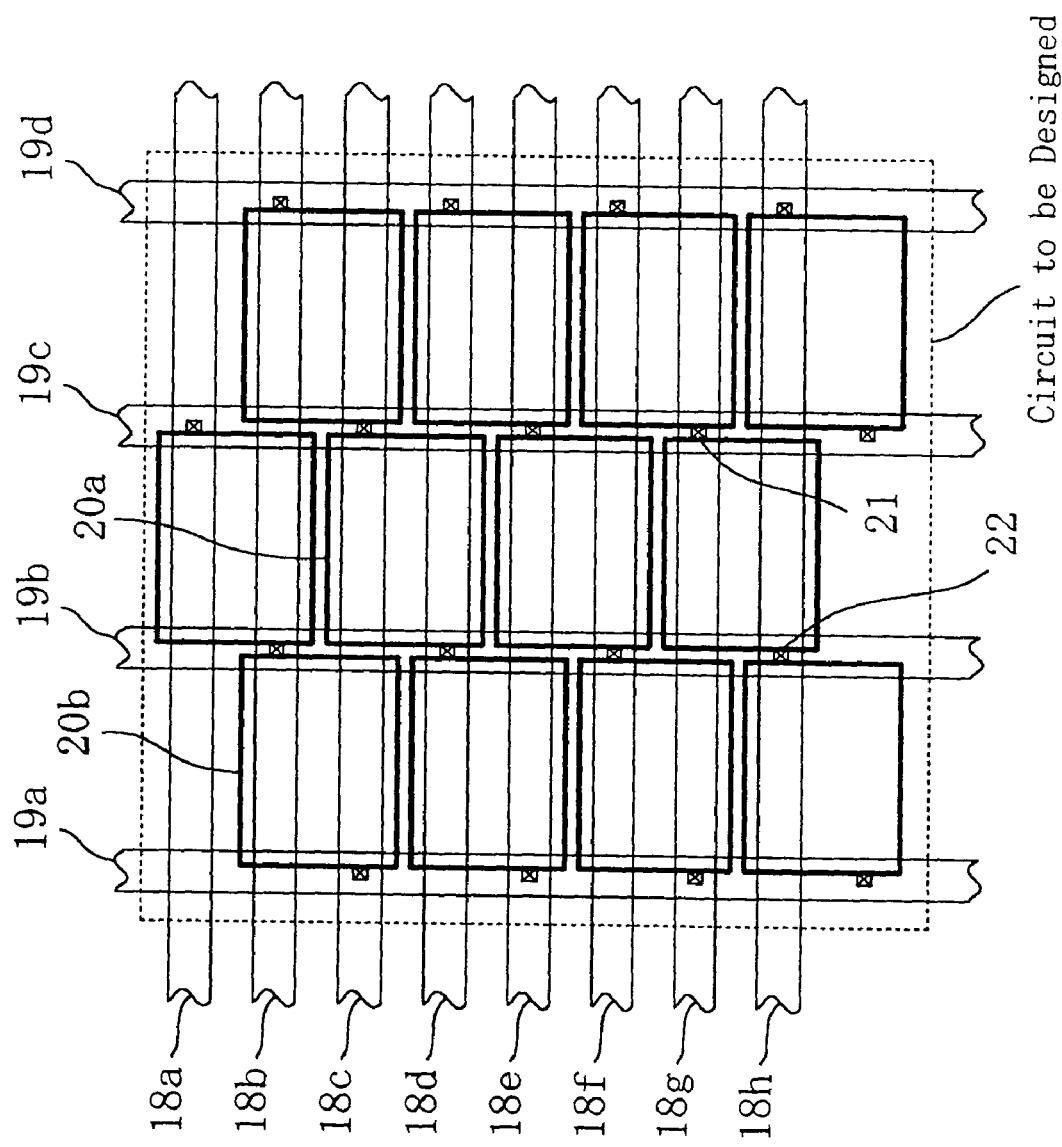

INTEGRATED CIRCUIT DEVICE AND METHOD FOR FORMING THE SAME

RELATED APPLICATIONS

This application is a Divisional of U.S. application Ser. No. 12/271,501, filed Nov. 14, 2008, now U.S. Pat. No. 7,737,473 which is a Continuation of U.S. application Ser. No. 11/633,569, filed Dec. 5, 2006, now U.S. Pat. No. 7,465,974, which is a Divisional of U.S. application Ser. No. 10/879,754, filed Jun. 30, 2004, now U.S. Pat. No. 7,155,684, which is a Continuation of U.S. application Ser. No. 10/084,978, filed Mar. 1, 2002, now U.S. Pat. No. 6,794,674, claiming priority of Japanese Application No. 2001-060090, filed Mar. 5, 2001, the entire contents of each of which are hereby incorporated by reference.

BACKGROUND OF THE INVENTION

The present invention relates to a wiring structure in an integrated circuit device and to a method for forming the same. More particularly, it relates to a method for optimizing an amount of voltage drop in wiring.

In an integrated circuit represented by a digital circuit, logic gates including an AND gate and a NOR gate are used as elements for composing the circuit. A unit for organizing the logic gates into the circuit is termed a cell. In the digital circuit, cells having different functions in accordance with the types of the logic gates are prepared. By combining the different types of cells, the whole digital circuit acquires a necessary function.

In a typical digital circuit, a ground wiring layer and a power supply wiring layer are provided over a region in which a large number of cells are placed. The cells are arranged laterally such that the respective power supply lines of the cells are connected to each other and that the respective ground lines thereof are connected to each other. Hereinafter, a group of cells arranged laterally will be termed a cell raw.

The cells contain electronic elements required to compose the circuit, e.g., MOS transistors as components. For example, a CMOS inverter circuit contains a PMOS transistor and an NMOS transistor and has a power supply terminal connected to the power supply line of the cell, while having a ground terminal connected to the ground line of the cell. It is to be noted that a circuit in the present specification indicates a portion obtained by connecting electronic elements with a wire (in a broad sense) and does not indicate a closed circuit (in a narrow sense). For example, a CMOS inverter circuit indicates a circuit having a power supply terminal and a ground terminal which are not connected to the power supply line and the ground line, respectively.

FIG. 10 is a plan view showing the respective structures of a cell placement region, power supply lines, and ground lines in a conventional digital circuit composed of cells. As shown in the drawing, a plurality of cell rows 105x are aligned vertically in the cell placement region. Each of the cell rows is composed of a plurality of cells 105 arranged laterally. The cell placement region is defined by trunk power supply lines 107a and trunk ground lines 107b each extending vertically and by branch power supply lines 108a and branch ground lines 108b each extending laterally. Power supply voltages and ground voltages are supplied from the trunk power supply lines 107a and the trunk ground lines 107b on both sides of the cell placement region to the individual cells 105 via element power supply lines 106a and element ground lines 106b. The trunk power supply lines 107a and the trunk ground lines 107b are connected to the branch power supply lines 108a and the branch ground lines 108b via through-hole connecting terminals 109a-1 and 109b-1, respectively. In a cross-sectional structure of a semiconductor integrated circuit device, individual wiring layers are insulated by interlayer insulating films, though they are not shown in FIG. 10, and conductor members filled in through holes formed by opening the interlayer insulating films are termed the through-hole connecting terminals.

In the present specification, the power supply lines and the ground lines are generally termed "voltage supply lines".

The element power supply lines 106a, the element ground lines 106b, the branch power supply lines 108a, and the branch grounded lines 108b each extending laterally in FIG. 10 are provided in a certain wiring layer. On the other hand, the trunk power supply lines 107a and the trunk ground lines 107b are provided in another wiring layer. The semiconductor integrated circuit device is provided on a semiconductor chip having power supply pads and ground pads to be connected to the branch power supply lines 108a and the branch ground lines 108b, respectively. The power supply pads and the ground pads are provided in the uppermost layer of the semiconductor chip so that the semiconductor integrated circuit device is electrically connectable to a power supply line and to a ground supply line each external of the semiconductor chip via the power supply pads and the ground pads.

Thus, in the state shown in a plan view, the element power supply lines 106a and the element ground lines 106b provided in the same wiring layer and extending laterally intersect the trunk power supply lines 107a and the trunk ground lines 107b provided in the other wiring layer and extending vertically. At the points of intersection of the power supply lines 106a and the trunk power supply lines 107a, the power supply lines 106a and the trunk power supply lines 107a are connected to each other via through-hole connecting terminals 109a-2. On the other hand, the ground lines 106b and the trunk ground lines 107b are connected to each other via through-hole connecting terminals 109b-2 at the points of intersection of the ground lines 106b and the trunk ground lines 107b.

Thus, each of the wiring layer is internally provided with the plurality of lines extending in a specified direction. Since the through-hole connecting terminals are provided as required at the points of intersection of the lines contained in the different wiring layers, lines other than those shown in FIG. 10 should be placed with consideration. When signal lines, e.g., are placed in the individual wiring layers, the signal lines should be placed while avoiding the points of intersection.

However, the wiring structure in the conventional semiconductor integrated circuit device has the following drawbacks.

In the conventional structure, the points of intersection restrict the flexibility with which the signal lines are placed. It will be understood that the area allocated to the signal lines is reduced by the points of intersection. Moreover, the branch power supply lines 108a and the branch ground lines 108b are provided in the same wiring layer (first wiring layer) and the element power supply lines 106a of the cells and the element ground lines 106b thereof are also provided in the same wiring layer (first wiring layer). As a result, the cell rows 105x cannot be placed immediately below the branch power supply lines 108a and the branch ground lines 108b. This is because, under such a placement condition, the element power supply lines 106a of the cell rows 105x and the element ground lines 106b thereof are in contact with the branch power supply lines 108a and the branch ground lines 108b so that each of the element power supply lines 106a and the element ground lines 106b is short-circuited. In short, a portion of the cell placement region corresponding to the area occupied by the branch power supply lines 108a and the branch ground lines 108b is lost.

Thus, the conventional wiring structure is suitable for use in a semiconductor chip in which a fewer types of element circuits, such as a single digital circuit or a single SRAM (static random access memory), are integrated. In that case, the number of wiring layers is generally on the order of two. Since the number of wiring layers is small, an emphasis has been placed conventionally on the provision of an area for a region required for the signal lines.

However, the advent of a semiconductor chip having a plurality of circuits including a digital circuit, a SRAM, a DRAM (dynamic random access memory), a flash memory, and an analog circuit merged therein is expected in the future. Moreover, improvements in process technology allow miniaturization of elements in a semiconductor integrated circuit device so that an increase in the degree of integration of the digital circuit is also expected.

Therefore, the future trend in a semiconductor integrated circuit device is inevitably toward a larger wiring area required for the voltage supply lines of the individual element circuits and for signal lines and toward a larger number of wiring layers. The probability is higher that, in near future, a semiconductor integrated circuit device having, e.g., about six to ten wiring layers will be a main stream. As a transistor has been miniaturized increasingly by the improvements in process technology, a reduction in the power supply voltage of the transistor has been required not only in terms of lowering power consumption but also ensuring smooth operation of the transistor.

In a semiconductor integrated circuit device with a lower power supply voltage, allowance for voltage drop in the voltage supply lines is lowered. This is because, e.g., a slight reduction in power supply voltage causes a significant reduction in the operating speed of a transistor in the circuit. Accordingly, stricter restrictions will be placed on a drop in power supply voltage during the operation of the circuit in a future semiconductor integrated circuit device. Of the voltage drop, a drop (IR drop) resulting from the resistance of wiring accounts for a large proportion so that it is necessary to reduce the wiring resistance of the voltage supply lines. In the signal lines also, it is effective to reduce the resistance in minimizing signal delay. To reduce the wiring resistance, it is necessary not only to select a material for the wiring but also to increase the wiring area or the like. In increasing an area occupied by the voltage supply lines, an increase in the number of wiring layers and an increase in line width are effective. However, it is highly probable that an increased number of wiring layers increases fabrication cost for the integrated circuit device. On the other hand, an increased number of voltage supply lines reduces a space in which signal lines are placed accordingly.

Thus, a mere increase in the total area occupied by the voltage supply lines may cause increased fabrication cost or a degraded characteristic such as signal delay.

The power supply lines in the semiconductor integrated circuit device also have the drawback of causing the detriment of electromagnetic interference noise, which is generally termed EMI. In terms of product quality control, there is a stringent request on the electromagnetic interference noise that it should be smaller than a publicly determined minimum amount. It is known that the electromagnetic interference noise is caused by an inductance resulting from a time-varying change of a current flowing in the portion of a through-hole connecting terminal (e.g., a lead of a package or a wire) for providing a connection between the semiconductor integrated circuit device or the like and an external terminal. As a method for suppressing the electromagnetic interference noise, there is one which provides a capacitance between the power supply and the ground. However, the provision of the capacitance which requires a large area causes the drawback that an area for the cells and lines is reduced.

Hence, the power supply lines and the ground lines in future semiconductor integrated circuit devices should have structures which eliminate the foregoing drawbacks.

There is also a serious problem associated with an increase in the number of through-hole connecting terminals and the miniaturization thereof in future semiconductor integrated circuits, which are entailed by the merging of various types of circuits therein and the resultingly complicated structures thereof. The increased number of through-hole connecting terminals that have been miniaturized may significantly increase the probability of faulty connecting states. The faulty connecting states cause not only unexpected voltage drop but also maloperation of the entire circuit due to the current density in wiring which is increased locally. To prevent these, there is a growing demand on means for easily testing the connecting states at the through-hole connecting terminals.

In particular, a connected or unconnected state at a through-hole connecting terminal for providing a connection between lines each contained in a voltage supply wiring structure is related to whether or not an amount of voltage drop has a design value. If the through-hole connecting terminal which should be connected is in the unconnected state, a current path is interrupted at the through-hole connecting terminal in the unconnected state so that the amount of voltage drop is higher than the design value.

If the area occupied by the voltage supply lines is minimized, the width of each of the lines is reduced and the number of the through-hole connecting terminals is also reduced so that a current density in the lines approaches a permissible value and a design margin is reduced. The same shall apply to a current density at the through-hole connecting terminal. In addition, the through-hole connecting terminals in the semiconductor integrated circuit device are expected to be miniaturized in future, similarly to the other components thereof. As the through-hole connecting terminals are miniaturized increasingly, there should be a growing need to guarantee the connected states at the through-hole connecting terminals.

In the case of bonding two semiconductor chips to each other to provide a connection therebetween or bonding a semiconductor chip to an integrated substrate named as a micro substrate containing voltage supply lines and signal lines necessary for the operation of the semiconductor chip to provide a connection therebetween, which is a technology of recent remark, the testing of the connecting states at the connecting terminals bonded to each other is absolutely necessary.

SUMMARY OF THE INVENTION

It is therefore an object of the present invention to provide a wiring structure in conformance with trends toward miniaturized electronic elements, complicated circuit configurations, and different types of merged (highly integrated) circuits and a method for forming the same, while eliminating the foregoing drawbacks of an integrated circuit device, especially a semiconductor integrated circuit device.

A first integrated circuit device according to the present invention has a circuit portion including a plurality of electronic elements and comprises: a plurality of first element voltage supply lines connected to a higher potential terminal of the circuit portion; a plurality of second element voltage supply lines connected to a lower potential terminal of the circuit portion; a first trunk voltage supply line connected to each of the plurality of first element voltage supply lines; a second trunk voltage supply line connected to each of the plurality of second element voltage supply lines; a first branch voltage supply line connected to the first trunk voltage supply line to supply a voltage from the outside to the first trunk voltage supply line; a second branch voltage supply line connected to the second trunk voltage supply line to supply a voltage from the outside to the second trunk voltage supply line; a first wiring layer provided above the circuit portion to have the first and second element voltage supply lines and the first and second trunk voltage supply lines placed therein; and at least one upper wiring layer provided above the first wiring layer to have the first and second branch voltage supply lines placed therein.

The arrangement allows the first and second element voltage supply lines and the first and second trunk voltage supply lines to be provided in the same first wiring layer so that the number of wiring layers required for voltage supply and the wiring area are reduced.

The upper wiring layer includes a second wiring layer and a third wiring layer provided above the second wiring layer. The arrangement reduces a reduction in wiring area caused by the provision of connecting terminals such as through-hole connecting terminals. By placing signal lines in the third wiring layer located above the second wiring layer, a signal transition on the signal line can be measured easily.

The first integrated circuit device further comprises: a first chip; and a second chip serving as a substrate used only for wiring, wherein the third wiring layer is provided in the second chip and the voltage supply lines in the first wiring layer and the voltage supply lines in the third wiring layer are connected to each other by bonding the first and second chips to each other. The arrangement reduces the number of connecting terminals and improves an assembly yield.

The first integrated circuit device further comprises: a first chip; and a second chip serving as a substrate used only for wiring, wherein the circuit portion and the first wiring layer are provided in the first chip, the first branch voltage supply line is provided in the second chip, and the first trunk voltage supply line and the first branch voltage supply line are connected to each other by bonding the first and second chips to each other. The arrangement reduces the number of connecting terminals between the first trunk voltage supply line and the first branch voltage supply line.

The first integrated circuit device further comprises: a first chip and a second chip serving as a substrate used only for wiring, wherein the circuit portion and the first wiring layer are provided in the first chip, the second branch voltage supply line is provided in the second chip, and the second trunk voltage supply line and the second branch voltage supply line are connected to each other by bonding the first and second chips to each other. The arrangement reduces the number of connecting terminals between the second trunk voltage supply line and the second branch voltage supply line.

The first integrated circuit device further comprises: first and second connecting terminals each provided at a connecting point between the first trunk voltage supply line and the first branch voltage supply line, wherein the first and second connecting terminals are disposed in spaced apart relation with a given distance or more therebetween. The arrangement compensates for an increased wiring resistance of each of the first and second element voltage supply lines and reduces the number of wiring layers required for voltage supply and the wiring area.

The first integrated circuit device further comprises: first and second connecting terminals each provided at a connecting point between the second trunk voltage supply line and the second branch voltage supply line, wherein the first and second connecting terminals are disposed in spaced apart relation with a given distance or more therebetween. The arrangement achieves the same effects.

A second integrated circuit device according to the present invention has first and second circuit portions each including electronic elements and comprises: a first voltage supply line; a second voltage supply line connected to the first voltage supply line to supply a voltage to the first circuit portion; a third voltage supply line connected to the first voltage supply line to supply a voltage to the second circuit portion; a first connecting terminal for connecting the first and second voltage supply lines to each other; and a second connecting terminal for connecting the first and third voltage supply lines to each other, the device being configured to electrically isolate the second and third voltage supply lines from each other during testing of a connecting state at the first connecting terminal.

The arrangement allows easy determination of whether or not the connecting state at the first connecting terminal is appropriate by judging the first connecting terminal to be connected if the first circuit portion performs a given operation and judging the first connecting terminal to be unconnected if the first circuit portion does not perform the given operation.

A third integrated circuit device according to the present invention has first and second circuit portions each including electronic elements and comprises: a first element voltage supply line connected to a higher-potential or lower-potential terminal of the first circuit portion; a second element voltage supply line connected to a lower-potential or higher-potential terminal of the first circuit portion; a third element voltage supply line connected to a higher-potential or lower-potential terminal of the second circuit portion; a first trunk voltage supply line connected to each of the first and third element voltage supply lines; a second trunk voltage supply line connected to the second element voltage supply line; a first branch voltage supply line connected to the first trunk voltage supply line to supply a voltage from the outside to the first trunk voltage supply line; a second branch voltage supply line connected to the second trunk voltage supply line to supply a voltage from the outside to the second trunk voltage supply line; a first wiring layer having the first, second, and third element voltage supply lines and the first and second trunk voltage supply lines provided therein; and at least one upper wiring layer located above the first wiring layer to have the first and second branch voltage supply lines provided therein.

The arrangement provides a structure tolerant to high-precision design so that the number of wiring layers for voltage supply and the wiring area are further reduced.

In the third integrated circuit device, the first trunk voltage supply line is composed of first and second wiring portions, the first wiring portion is connected to the first element voltage supply line, and the second wiring portion is connected to the third element voltage supply line, the device being configured to electrically isolate the first and second wiring portions from each other during testing of a connecting state between the first wiring portion and the first branch voltage supply line. The arrangement provides a structure which allows easy examination of whether or not an appropriate connecting state is provided between the first wiring portion and the first branch voltage supply line.

A fourth integrated circuit device has first and second circuit portions each including electronic elements and comprises: a first element voltage supply line connected to a higher-potential terminal of the first circuit portion; a second element voltage supply line connected to a lower-potential terminal of the first circuit portion; a third element voltage supply line connected to a higher-potential terminal of the second circuit portion; a fourth element voltage supply line connected to a lower-potential terminal of the second circuit portion; a first trunk voltage supply line connected to the first element voltage supply line; a second trunk voltage supply line connected to each of the second and fourth element voltage supply lines; a third trunk voltage supply line connected to the third element voltage supply line; a first branch voltage supply line connected to each of the first and third trunk voltage supply lines to supply a voltage from the outside to each of the first and third trunk voltage supply lines; a second branch voltage supply line connected to each of the second and fourth trunk voltage supply lines to supply a voltage from the outside to each of the second and fourth trunk voltage supply lines; a first wiring layer having the first to fourth element voltage supply lines and the first to third trunk voltage supply lines provided therein; and at least one upper wiring layer located above the first wiring layer to have the first and second branch voltage supply lines provided therein.

In the arrangement, each of the first and third trunk voltage supply lines is connected to the first branch voltage supply line. This compensates for an increased wiring resistance of each of the first and third element voltage supply lines and thereby reduces the number of wiring layers required for voltage supply and the wiring area.

In the fourth integrated circuit device, the first trunk voltage supply line is composed of first and second wiring portions, the device being configured to electrically isolate the first and third trunk voltage supply lines from each other during testing of a connecting state between the first trunk voltage supply line and the first branch voltage supply line. The arrangement provides a structure which allows easy examination of whether or not an appropriate connecting state is provided between the first trunk voltage supply line and the first branch voltage supply line.

In the fourth integrated circuit device, the second trunk voltage supply line is composed of first and second wiring portions, the device being configured to electrically isolate the second and fourth trunk voltage supply lines from each other during testing of a connecting state between the second trunk voltage supply line and the fourth branch voltage supply line. The arrangement provides a structure which allows easy examination of whether or not an appropriate connecting state is provided between the second trunk voltage supply line and the second branch voltage supply line.

A method for forming a wiring structure according to the present invention comprises the steps of: (a) determining an amount of voltage drop due to a resistance of a voltage supply line connected to a circuit portion of an integrated circuit device and a wiring structure equation representing a correlation between an area of the circuit portion and a current therein; (b) determining, when the circuit portion is subdivided while a ratio between the area of the circuit portion and the current therein is maintained, a circuit characteristic equation representing a correlation between an area of each of subdivided circuit portions and a current therein; and (c) determining a structure of the voltage supply line such that the area of the subdivided circuit portion and the current therein are equal to or less than an area and a current given by solutions of simultaneous equations composed of the wiring structure equation and the circuit characteristic equation.

The method allows optimum distribution of the amount of voltage drop in the voltage supply line and the wiring area thereof and the current consumed in the circuit portion connected to the voltage supply line.

BRIEF DESCRIPTION OF THE DRAWINGS

FIG. 4 shows another example of the structures of branch power supply lines and branch ground lines according to the present invention, in which unit structures are arranged in a staggered pattern;

DETAILED DESCRIPTION OF THE INVENTION

—Plan Structure of Semiconductor Integrated Circuit Device—

Figure 1:
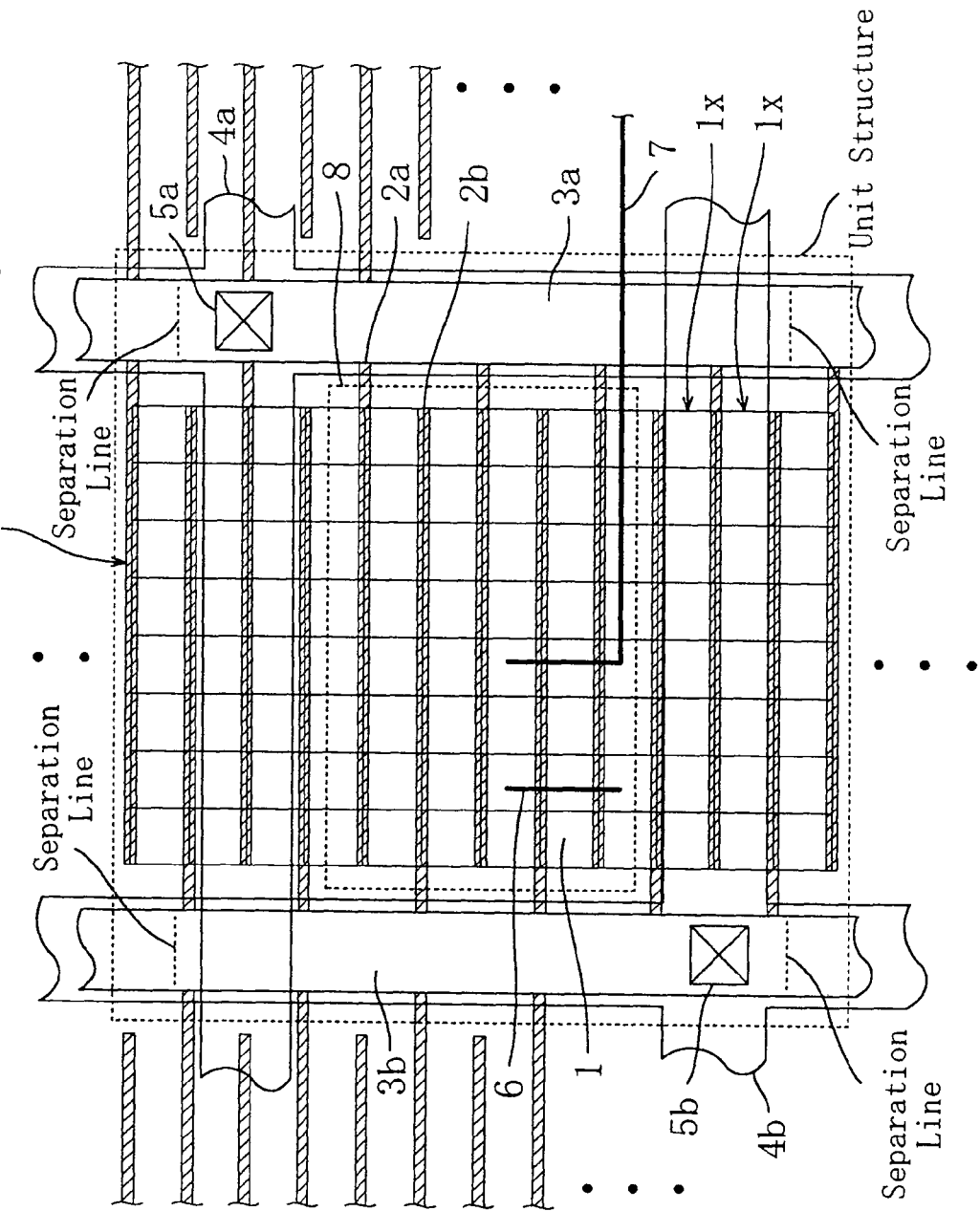
FIG. 1 is a plan view for illustrating a unit structure of voltage supply lines according to an embodiment of the present invention.

FIG. 1 is a plan view showing the respective structures of a cell placement region and voltage supply lines (in the present specification, power supply lines and ground lines are generally termed "voltage supply lines"). As shown in the drawing, a plurality of cell rows $1x$ are aligned vertically in the cell placement region. Each of the cell rows $1x$ is composed of a plurality of cells 1 arranged laterally. The cell placement region is defined by a trunk power supply line $3a$ and a trunk ground line $3b$ (which are termed generally "trunk voltage supply lines) each extending vertically and by a branch power supply line $4a$ and a branch ground line $4b$ (which are termed generally "branch voltage supply lines") each extending vertically.

Figure 10:
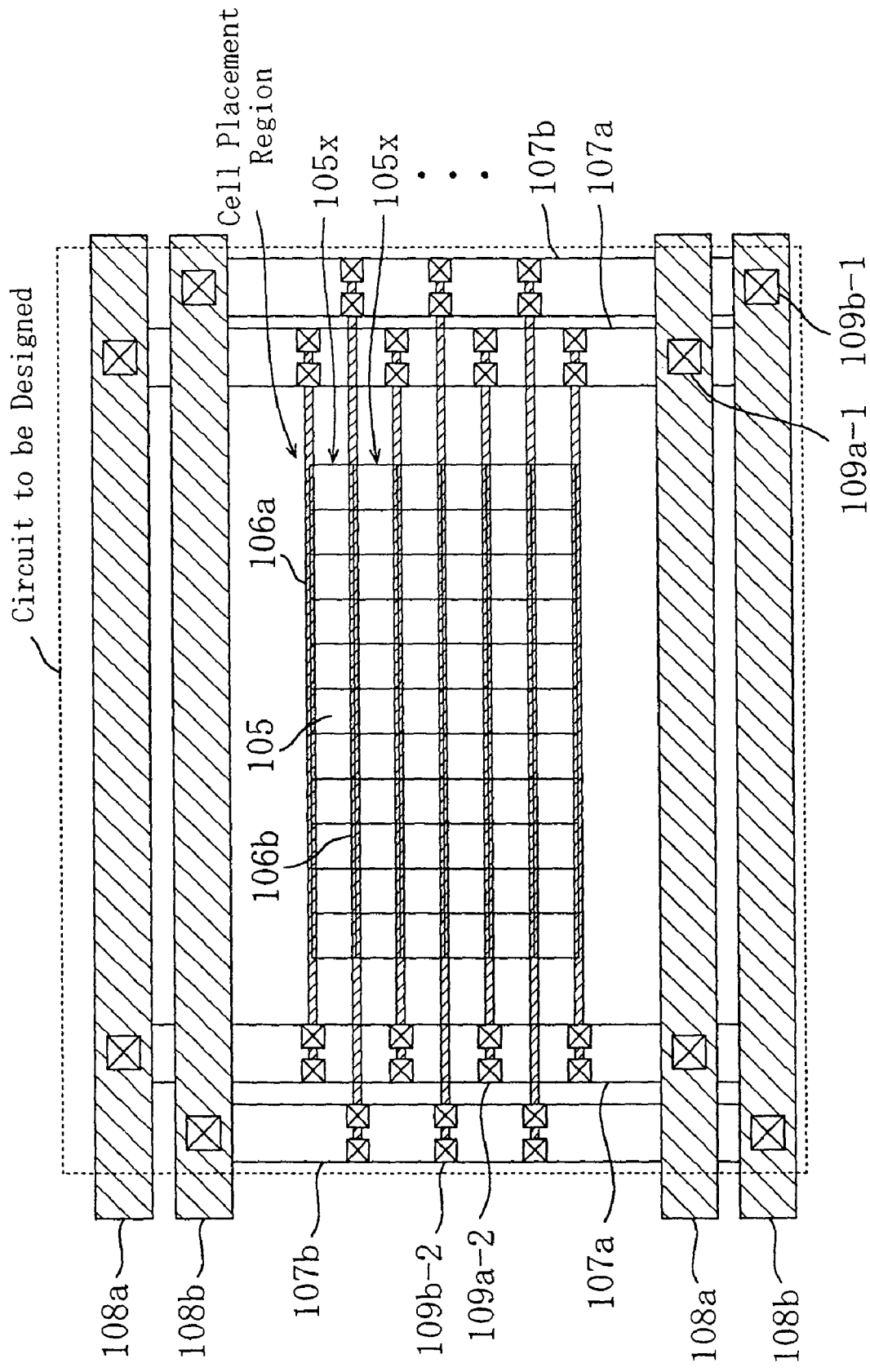
FIG. 10 is a plan view showing a conventional voltage supply wiring structure.

In an embodiment according to the present invention, the trunk power supply line 3a and the trunk ground line 3b are placed on the right and left sides of the cell placement region, respectively, which is different from the conventional digital circuit shown in FIG. 10 in which the respective pairs of trunk power supply lines and trunk ground lines are provided on both sides of the cell placement region. In addition, a branch power supply line 4a is placed in overlapping relation with the trunk power supply line 3a placed on the right side of the cell placement region, while a branch ground line 4b is placed in overlapping relation with the trunk ground line 3b placed on the left side of the cell placement region. Power supply voltages are supplied from the trunk power supply line 3a to the individual cells 1 via respective element power supply lines 2a extending leftward, while ground voltages are supplied from the trunk ground line 3b to the individual cells 1 via respective element ground lines 2b extending rightward. In the present specification, the element power supply lines 2a and the element ground lines 2b are termed generally "element voltage supply lines".

It is to be noted that the element power supply lines 2a and the element ground lines 2b, each extending laterally, and the trunk power supply line 3a and the trunk ground line 3b, each extending vertically, are provided in a certain wiring layer (first wiring layer). On the other hand, the branch power supply 4a and the branch ground line 4b each extending vertically are placed in another wiring layer (upper wiring layer). The trunk power supply line 3a and the branch power supply line 4a are connected to each other via a through-hole connecting terminal 5a, while the trunk ground line 3b and the branch ground line 4b are connected to each other via a through-hole connecting terminal 5b. In a cross-sectional structure of the semiconductor integrated circuit device, the individual layers are insulated from each other by interlayer insulating films, though they are not shown in FIG. 1, and conductor members filled in through holes formed by opening the interlayer insulating films are termed the through-hole connecting terminals.

In the first wiring layer, on the other hand, the element power supply lines 2a and the trunk power supply line 3a are connected to each other without intervention of the through-hole connecting terminals and the element ground lines 2b and the trunk ground line 3b are connected to each other without intervention of through-hole connecting terminals.

In either of the wiring layers, a short-distance signal line 6 and a long-distance signal line 7 are provided. The short-distance signal line 6 provides a connection between the respective signal terminals of two cells placed under the both tip portions thereof. The long-distance signal line 7 provides a connection between the respective signal terminals of one cell placed under one of the end portions thereof and another cell (not shown) located at a distance from the cell. There is also provided a passage hole 8 which allows the signal line 7 to pass through the wiring layer provided with the element voltage supply lines and with the trunk voltage supply lines to reach the upper wiring layer provided with the branch power supply line 4a and the branch ground line 4b.

The dotted lines shown as separation lines are irrelevant to the description given herein. The separation lines will be described later.

—Voltage Supply Wiring Structure—

Next, a voltage supply wiring structure will be described in detail. For the sake of clarity, it is assumed that the voltage supply wiring structure is divided into first and second structures. Although the following description uses the structure of the power voltage supply lines as an example, the same shall apply to the structure of the ground lines. The first structure of the voltage supply lines includes a portion composed of, e.g., the element power supply lines 2a and element ground lines 2b of the cells 1, the trunk power supply line 3a, the trunk ground line 3b, and the through-hole connecting terminals 5a and 5b, i.e., a portion including the first wiring layer and the through-hole connecting terminals.

The unit structure defined by the broken lines in FIG. 1 is among a plurality of identical unit structures which are arranged as a matrix in the integrated circuit device to constitute a whole large structure, though it is not shown in FIG. 1. The large structure is a digital circuit having a function. The large structure will be described later in detail with reference to FIGS. 3 and 4.

An amount of voltage drop in the lines included in the first structure has a property, which will be described below. By way of example, it is assumed that a voltage at the through-hole connecting terminal 5a has a constant value, a current consumed by the cells 1 included in the unit structure flows in evenly distributed relation in the individual cells 1. It is also assumed that the resistance of the voltage supply lines contained in a unit area, i.e., a so-called sheet resistance does not vary. If the area of the unit structure is assumedly reduced on condition that the ratio between the vertical and horizontal sizes of the unit structure is constant, the distance between the through-hole connecting terminal 5a at which the voltage has a constant value and each of the cells 1 is reduced so that the distance between the through-hole connecting terminal 5a and each of current sources is reduced if the cells 1 are considered to be current sources. This indicates that, if the width of each of the element power supply lines 2a of the cells 1 and the width of the trunk power supply line 4a are constant, the resistance (the total resistance of the element power supply lines 2a and the trunk power supply line 3a, i.e., the total resistance of the lines in a path along which a current flows) of the power supply lines between the through-hole connecting terminal 5a at which the voltage has a constant value and each of the current sources (cells 1) is reduced. If the current consumed by the unit structure is assumed to be constant, it will be understood that the amount of voltage drop in the wiring path between the through-hole connecting terminal 5a and each of the current sources (cells 1) is reduced since the resistance of the power supply lines is reduced.

Conversely, if it is assumed that the current consumed by the unit structure is not constant and the amount of voltage drop in the wiring path between the through-hole connecting terminal 5a and each of the current sources (cells 1) is constant, the consumed current is allowed to increase by the Ohm's law, since the resistance of the power supply lines is reduced. Likewise, if the amount of voltage drop is held constant when the area of the unit structure is increased, the consumed current should be reduced. The relation is similar to the inversely proportional relation given by the following equation (1):

$$Vd = (Sb) \times (Ib) \quad (1)$$

where Vd is an amount of voltage drop, Sb is an area of the unit structure, and Ib is a consumed current. It can be seen from the foregoing equation (1) that, for a reduced amount Vd of voltage drop, it is necessary to reduce the product (Sb)×(Ib) of the area and the consumed current.

Figure 5B:
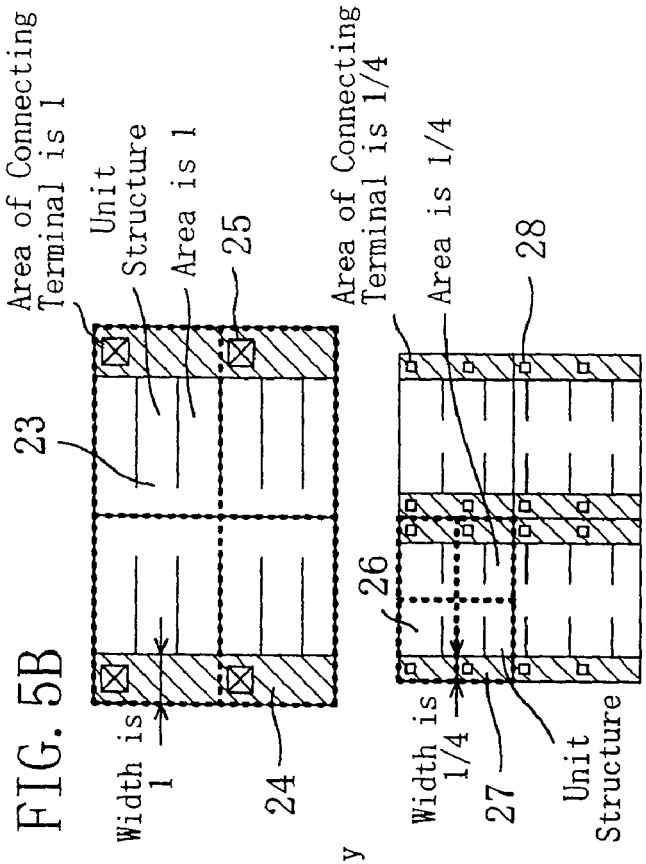
FIG. 5B is a view for illustrating that the total area occupied by trunk power supply lines is reduced by dividing the unit structures.
Figure 5A:
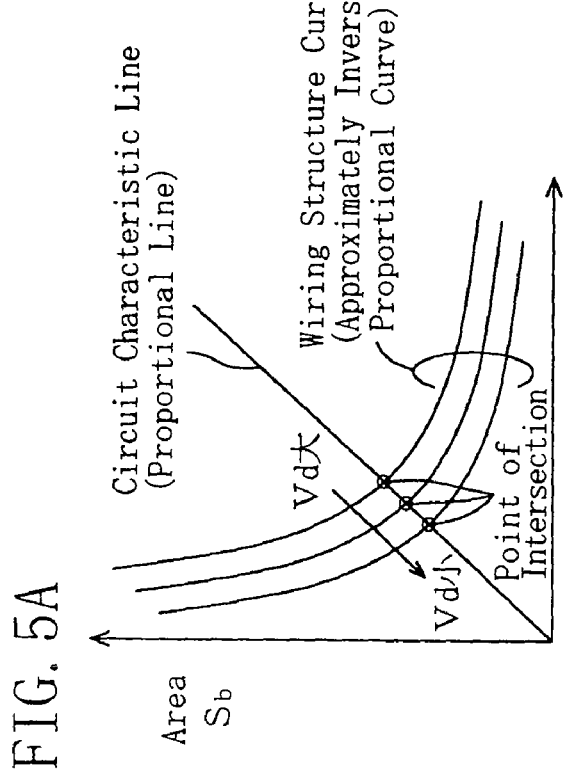
FIG. 5A is a view for illustrating that a point of intersection exists between a wiring structure curve and a circuit characteristic line.

FIG. 5A is a view for illustrating a method for determining the current and the area by using a wiring structure curve and a circuit characteristic line.

In FIG. 5A, the vertical axis represents the area Sb of the unit structure, the horizontal axis represents the current Ib, and the amount Vd of voltage drop is adopted as a parameter. As stated previously, the area Sb of the unit structure has a functional relationship between itself and the resistance of the voltage supply lines included in the unit structure. If the area Sb in the equation (1) is replaced with the resistance, therefore, the equation of the Ohm's law is obtained. The equation expressing the wiring structure curve shown in FIG. 5A in functional relation will be termed a wiring structure equation. FIG. 5A shows the three wiring structure curves corresponding to the three amounts Vd of voltage drop. In the drawing, the lefter wiring structure curves represent the progressively smaller amounts Vd of voltage drop.

FIG. 5A also shows the circuit characteristic line, which is a proportional line. The circuit characteristic line represents an equation (2) expressing the relationship between the area Sb of the unit structure and the consumed current Ib when a functional circuit for which the voltage supply lines are to be designed is divided into groups of cells composing the individual unit structures, while the ratio Sbb/Ibb between a total area Sbb occupied by the groups of cells used in the functional circuit and the total current Ibb consumed thereby is held constant:

$$Sb=(Sbb/Ibb)\times(Ib) \quad (2).$$

Here, the functional circuit corresponds to a circuit to be designed shown in FIG. 3, 4, 7, or the like, which will be described later. It follows therefore that, at a point within the region Ra located above the circuit characteristic line (line representing the proportional relation expressed by the circuit characteristic equation) in FIG. 5A, the current consumed by the groups of cells in the unit structure resulting from division to occupy the area Sb is larger than the consumed current Ib indicated by the point. Such a method of assigning the groups of cells to the unit structure occupying an area within the region Ra is determined by the objective value of the consumed current represented by the wiring structure curve so that an area larger than an area occupied by the cells that have been assigned is provided. That is, the consumed current can be adjusted to a value indicated by the wiring structure curve but the area becomes excessively large so that a space is formed between the cell placement region and the voltage supply line region. This results in an unused region in the unit structure so that the degree of integration of the cells in the unit structure is reduced.

In the region Rb located below the circuit characteristic line in FIG. 5A, on the other hand, the area occupied by the cells that have been assigned can be adjusted to the objective value indicated by the wiring structure curve but the consumed current becomes lower than the objective value. Since the amount Vd of voltage drop eventually becomes lower than the objective value, the width of each of the voltage supply lines becomes excessively large so that a useless wiring region exists in the voltage supply lines. It will be understood that efficient design in terms of both area and consumed current can be performed by dividing the functional circuit into the groups of cells composing the individual unit structures such that the area and consumed current shown by the circuit characteristic equation are provided. In other words, the wiring structure can be optimized to minimize the useless portion of the area occupied by the voltage supply lines by dividing the functional circuit into the groups of cells composing the unit structures in accordance with the area and consumed current indicated by the point of intersection of the wiring structure curve and the circuit characteristic line corresponding to an amount of voltage drop as a design object.

It is to be noted that one point of intersection inevitably exits between the wiring structure curve and the circuit characteristic line. This is because the wiring structure curve is an inversely proportional curve and the circuit characteristic line is a proportional line. Since the wiring structure curve is an inversely proportional curve irrespective of the structure of the voltage supply lines, the inversely proportional curve exists even if the first structure of the voltage supply lines is different from the structure adopted herein. It will be understood that the unit structures to which the groups of cells are assigned so as to provide an amount Vd of voltage drop as a given objective value also exist even if the first structure is different.

Even if the width of the trunk power supply line 3a is changed, while the structure of the element power supply lines 2a is left unchanged, the wiring structure curve shown in FIG. 5A exists so that a point of intersection exists between the wiring structure curve and the circuit characteristic line. As a result, it is constantly possible to assign the groups of cells to the unit structures such that the area and consumed current indicated by the point of intersection are provided. Therefore, the power supply lines will be designed such that the trunk power supply line 3a has a minimum line width. If the width of the trunk power supply line 3a is reduced, the resistance of the line increases. Accordingly, the wiring resistance of the unit structure increases but, by reducing the area of the unit structure, the amount Vd of voltage drop having the objective value is obtained. Alternatively, the amount Vd of voltage drop having the objective value is also obtainable by reducing the current consumed by the cells contained in the unit structure. By adopting either or both of the methods, the unit structure in which the amount of voltage drop has a value as a design object is obtainable.

Although the foregoing and following descriptions will be given only to the structure of the power supply lines, the same shall apply to the structure of the ground lines.

Thus far, the procedure of designing the lines by drawing the line and the curve in the coordinate system has been described with the view to proving designability. In most actual cases, the procedure of calculating the solutions of simultaneous equations consisting of the wiring structure equation and the circuit characteristic equation is performed.

—Procedure for Designing Wiring Structure—

Figure 6:
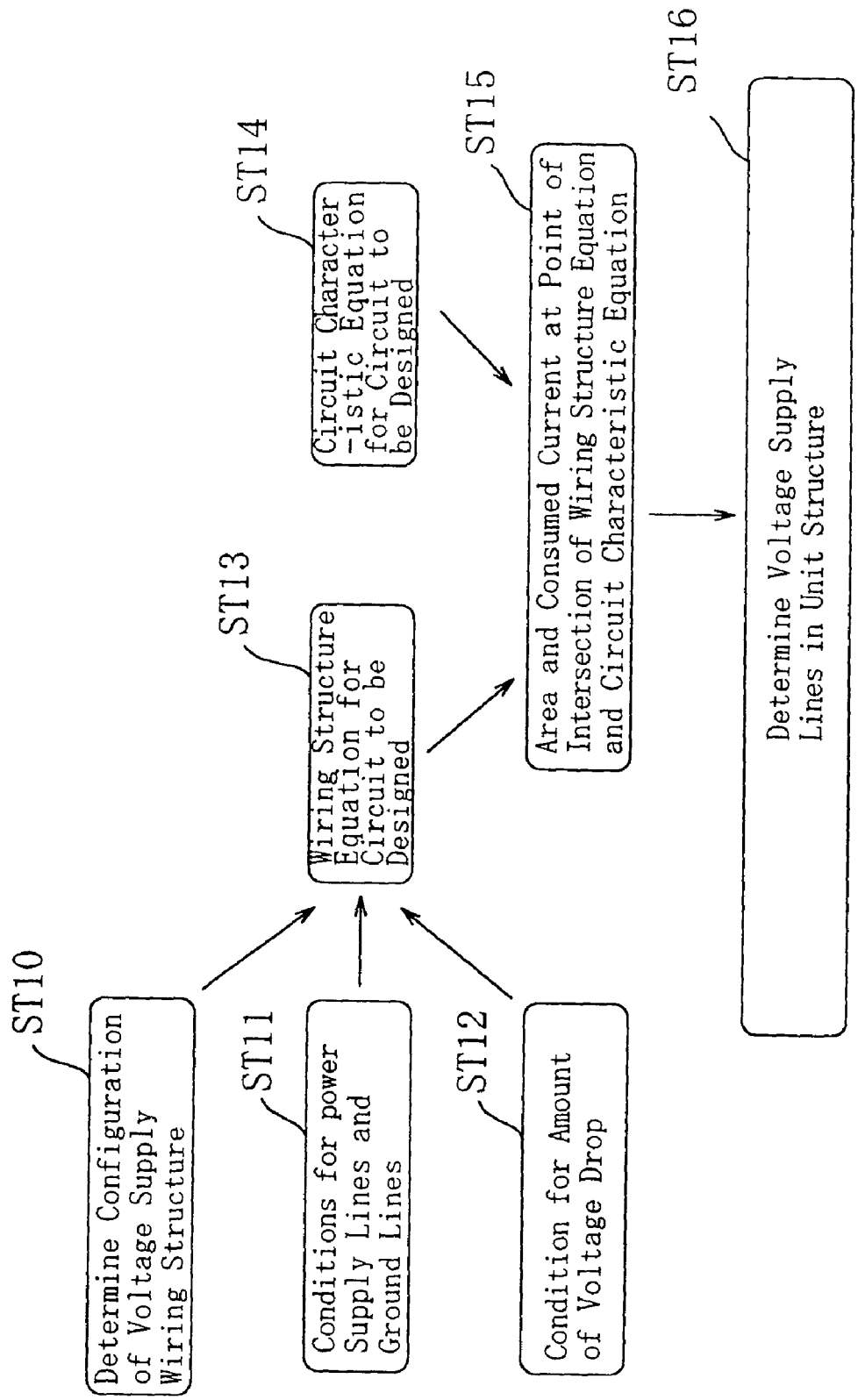
FIG. 6 is a design flow chart for implementing a unit structure having an area and a consumed current at a point of intersection of the wiring structure curve and the circuit characteristic line in accordance with a wiring forming method according to the embodiment.

FIG. 6 is a flow chart illustrating the procedure of designing the voltage supply wiring structure.

First, in Step ST10, the configuration of the voltage supply wiring structure is determined. In this step, the configurations of the element power supply lines 2a of the cells, the element ground lines 2b thereof, the trunk power supply line 3a, and the trunk ground line 3b, the position of the through-hole connecting terminal 5a for providing a connection between the branch power supply line 4a and the trunk power supply line 3a, and the position of the through-hole connecting terminal 5b for providing a connection between the branch ground line 4b and the trunk ground line 3b are determined. In short, the unit structure is determined.

Next, in Step ST11, conditions for the power supply lines and the ground lines are determined so that conditions for the wiring structure equation determined subsequently in Step ST13 are given. For example, the configurations of the trunk power supply line 3a and the trunk ground line 3b are designed so as to satisfy a permissible current density in each of the lines, as will be described later.

Next, in Step ST12, the amount Vd of voltage drop is determined so that the conditions for the wiring structure equation determined subsequently in Step ST13 are given.

Next, in Step ST13, the wiring structure equation for the circuit to be designed is determined by using the wiring configurations and the conditions obtained in Steps ST10 to ST12. In this step, the inversely proportional equation (1) (wiring structure curve) for the area of the unit structure of the power supply lines, the current consumed thereby, and the amount of voltage drop therein which are considered to be appropriate for the circuit to be designed are determined.

Next, in Step S14, the circuit characteristic equation (2) (circuit characteristic line) obtained in accordance with the area of the circuit to be designed and the current consumed thereby is determined. In this step, the proportional relationship between the area occupied by the circuit in the unit structure after the circuit to be designed is divided into the circuits of the unit structures and the current consumed thereby is obtainable.

Next, in Step ST15, the point of intersection of the wiring structure curve (1) and the circuit characteristic line (2) is determined to provide the area and consumed current at the point of intersection thereof.

Next, in Step ST16, the width of each of the element power supply lines 2a in the unit structure, the position of the through-hole connecting terminal 5a for providing a connection between the trunk power supply line 3a and the branch power supply line 4a, and the position of the through-hole connecting terminal 5b for providing a connection between the trunk ground line 3b and the branch ground line 4b are determined based on the area and consumed current obtained in Step ST15.

From the foregoing procedure, it seems that the width of the trunk power supply line 3a can be minimized by reducing the area of the unit structure. However, the degradation of the lines caused by a current, i.e., so-called electromigration actually occurs as an item to be considered in determining the width of the trunk power supply line in addition to the wiring resistance and the width of the line should be determined properly to suppress the electromigration. The general standard for suppressing the electromigration is such that the current density in the line does not exceed a regulated value. Accordingly, the minimum width of the trunk power supply line 3a is a value obtained when the current density calculated from the current Ib consumed by the groups of cells after assignment (groups of cells in the unit structure) is equal to the regulated value.

In the case of determining the width of the trunk power supply line 3a from the current density regulated to suppress the electromigration also, the width of the trunk power supply line after the subdivision of the unit structure can be reduced since, if the unit structure is subdivided, the current consumed by the groups of cells contained in the unit structure is also subdivided, similarly to the case of the wiring resistance. It will easily be appreciated that the current density should be lower than the value regulated to suppress the electromigration.

In general, the thickness of a line can be considered to be uniform in the process. If a current density is uniform, the ratio between current and line width is uniform. If the ratio between current and line width is uniform, an amount of voltage drop in the line when the length and thickness of the line are uniform is uniform in accordance with the Ohm's law. In other words, the amount of voltage drop in the line is uniform if the line width is reduced while the current density is held constant.

—Subdivision of Unit Structures—

FIG. 5B shows changes in wiring structure and in the structure of the through-hole connecting terminals when the unit structure containing the groups of cells is further subdivided into four unit structures. The upper part of FIG. 5B shows the structures prior to subdivision. The lower part of FIG. 5B shows the structure resulting from subdivision into the four unit structures. For the sake of clarity, FIG. 5B shows only the power supply lines and does not show the ground lines. As will be described later, FIG. 5B shows the state in which one through-hole connecting terminal 25 is provided in each of the subdivided unit structures, in contrast to FIGS. 3 and 4 in which the through-hole connecting terminal on the trunk power supply line in the unit structure is expressed as one through-hole connecting terminal.

As shown in the upper part of FIG. 5B, the lines extending laterally from the trunk power supply lines 24 located aside of the groups 23 of cells (see dot lines) assigned to the unit structures are element power supply lines in the structures prior to subdivision. It is assumed that the through-hole connecting terminals 25 for providing connections between the trunk power supply lines 24 and the branch power supply lines (not shown) are provided. Then, as shown in the lower part of FIG. 5B, the groups 23 of cells are further subdivided into four groups 26 of cells so that trunk power supply lines 27 and through-hole connecting terminals 28 for providing connections between the trunk power supply lines 27 and branch power supply lines (not shown) are formed for each of unit structures newly generated. However, the lower part of FIG. 5B shows only the groups of cells 26 contained in that one of the subdivided unit structures which is located in the upper left portion thereof. For the sake of clarity, the drawing of the groups of cells 26 contained in the other portions is omitted. The length-to-width ratio of the unit structure is the same before and after subdivision. The current consumed by the groups 26 of cells after subdivision is ¼ of the current consumed by the groups 23 of cells before subdivision. This allows the width of the trunk power supply line after subdivision to be reduced to ¼ of the width thereof before subdivision. The area occupied by each of the through-hole connecting terminals 28 is also reduced to ¼ such that the current density at the through-hole connecting terminal 28 is equal to that at the through-hole connecting terminal 25 before subdivision, similarly to the line width.

If the areas occupied by the trunk power supply lines 27 after the unit structure is subdivided into the four unit structures each containing the groups 26 of cells shown in the lower part of FIG. 5B are added up, the total area becomes ½ of the total area of the trunk power supply lines before subdivision. Since the length in the vertical direction is the same, if the line width prior to subdivision is assumed to be 1+1=2, ¼+¼+¼+¼=1 is satisfied so that the line width after subdivision is half the width of the trunk power supply line prior to subdivision.

On the other hand, the sum of the areas occupied by the through-hole connecting terminals 28 between the branch power supply lines and the trunk power supply lines after subdivision is the same as the sum of the areas occupied by the through-hole connecting terminals 25 prior to subdivision. Before subdivision, there are four through-hole connecting terminals each occupying an area of 1 so that the total area is 4. If the current density at the through-hole connecting terminal is assumed to be unchanged, the area occupied by each of the through-hole connecting terminals after subdivision becomes ¼ but the number of the through-hole connecting terminals becomes 16. Since the total area occupied by through holes after subdivision is 16/4=4, it follows that the area occupied by the through-hole connecting terminals is unchanged before and after subdivision.

From the foregoing example, it will be understood that, if the unit structure containing the groups of cells are subdivided progressively, the total area of the trunk power supply lines decreases, while the total area of the through-hole connecting terminals is unchanged. Since the current consumed by the unit structure and the area occupied thereby are reduced by increasing the number of partitions for the groups of cells, the amount of voltage drop is also reduced. By increasing the number of unit structures (i.e., through subdivision), not only the total area occupied by the trunk power supply lines is reduced but also the amount of voltage drop in the unit structure is reduced. Since a more preferred wiring structure is obtained as the area occupied by the voltage supply lines is smaller and the amount of voltage drop is smaller, it can be said that a wiring structure resulting from subdivision is an excellent structure.

Although the foregoing description has been given to the element power supply lines and to the trunk power supply lines, the foregoing subdivision process is also advantageous even to the element ground lines and to the trunk ground lines.

By increasing the number of partitions for the groups of cells, the length of each of the element power supply lines of the cells and the element ground lines thereof is reduced. As a result, the number of cells connected to the lines is reduced and the current flowing in each of the lines is reduced. This allows a margin for current density and therefore the width of each of the element power supply lines of the cells and the element ground lines thereof can be reduced to the extent which satisfies the permissible current density. In short, the area occupied by the cells including the element power supply lines and the element ground lines can be reduced.

—Description of Second Structure—

Although the description has been given thus far to the first structure, the whole structure of the voltage supply lines actually includes the branch power supply lines and the branch ground lines in addition to the first structure. Therefore, it is assumed that the second structure of the voltage supply lines is the structures of the branch power supply lines and the branch ground lines. Although a description will be given herein below to the structure of the branch power supply lines, the same shall apply to the structure of the branch ground lines. Although the foregoing description has shown that an increase in the number of partitions for the groups of cells is advantageous in the first structure, if an increase in the number of partitions for the groups of cells is disadvantageous in the second structure, the advantage in the first structure may be cancelled out by the disadvantage in the second structure. However, the subdivision of the unit structure containing the groups of cells is also advantageous to the second structure, as will be described below.

If the number of partitions for the groups of cells is increased, the number of the through-hole connecting terminals between the branch power supply lines and the trunk power supply lines is increased. Since the currents consumed by the groups of cells gather at the through-hole connecting terminals, it can be considered that a current source corresponding to the quantity of currents by the groups of cells is connected to the through-hole connecting terminals. An increase in the number of partitions for the groups of cells increases the number of the through-hole connecting terminals so that the distribution of the current source on the branch power supply lines reaches an almost even state. Since the total number of the cells is unchanged even if the unit structures containing the groups of cells are subdivided, the total consumed current is constant. If the basic pattern of the voltage supply lines is assumed to be the same in the second structure, the amount of voltage drop is lower when the current distribution is even than when the current distribution is uneven.

Figure 5D:
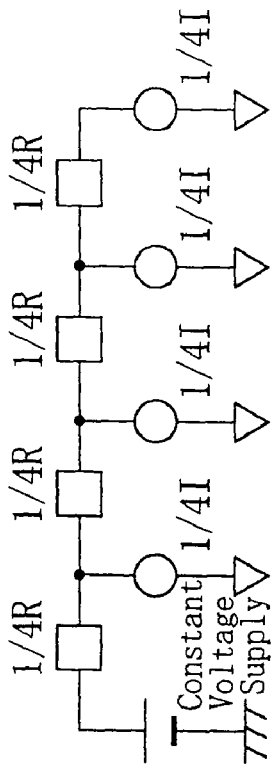
FIG. 5D is a view for calculating an amount of voltage drop when a source of the total current on a power supply line is provided discretely at four points.
Figure 5C:
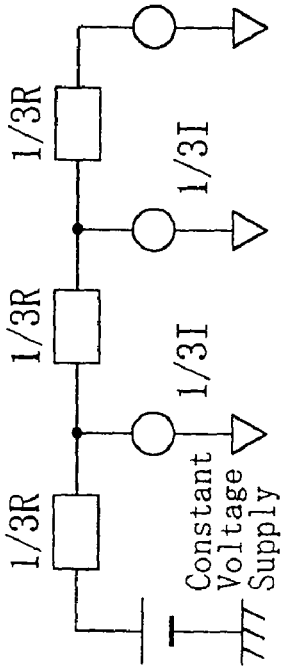
FIG. 5C is a view for calculating an amount of voltage drop when a source of the total current on a power supply line is provided discretely at three points.

FIGS. 5C and 5D illustrate respective current distributions on one voltage supply line when the current sources are provided separately at three positions and at four positions. It is assumed here that constant voltage supplies shown in FIGS. 5C and 5D have the same voltages and that the current sources each having the same total current are provided discretely at three or four positions in the same wiring structures. The total resistance of the line is assumed to be the same in either case.

As shown in FIG. 5C, if the current source is provided discretely at the three positions, the maximum amount Vdmax of voltage drop in the line is given by the following equation (3):

$$Vdmax = (1/3R)I + (1/3R)(2/3I) + (1/3R)(1/3I) \qquad (3)$$
$$= 16/24(RI).$$

On the other hand, if the current source is provided discretely at the four positions as shown in FIG. 5D, the maximum amount Vdmax of voltage drop in the line is given by the following equation (4):

$$Vdmax = (1/4R)I + (1/4R)(3/4I) + (1/4R)(2/4I) + \qquad (4)$$
$$(1/4R)(1/4I)$$
$$= 15/24(RI).$$

If a comparison is made between the equations (3) and (4), it will easily be appreciated that the maximum amount Vdmax of voltage drop is reduced by increasing the number of positions at which the current source is provided discretely from 3 to 4.

If the current source is provided discretely at N positions, the maximum amount Vdmax of voltage drop in the line is given by the following equation (5):

$$Vdmax = 1/N\{1/N + 2/N + 3/N + \ldots + (N-1)/N + N/N\} \qquad (5)$$
$$(RI)$$
$$= 1/N/N\{(N+1)N/2\}(RI)$$
$$= (N+1)/(2N) \times (RI).$$

If N is assumed to be infinite, the maximum amount Vdmax of voltage drop becomes ½(RI). In general, the maximum amount Vdmax of voltage drop approaches ½(RI) as the number of partitions for the groups of cells is increased. The same characteristic is obtainable from voltage supply lines in a plan configuration. The maximum amount Vdmax of voltage drop decreases as the number of the through-hole connecting terminals between the branch voltage supply lines and the trunk voltage supply lines increases and the through-hole connecting terminals are more evenly distributed. It is naturally assumed that the total consumed current is constant and the basic wiring pattern is unchanged even if the groups of cells are partitioned. Eventually, it will be appreciated that an increase in the number of partitions for the groups of cells offers an advantage in designing the voltage supply lines to each of the first and second structures of the voltage supply lines. In short, minimization of the region of the first structure is advantageous to the voltage supply lines as a whole. In other words, a larger number of partitions for the groups of cells is more advantageous in terms of an area occupied by the voltage supply lines and the amount of voltage drop. If the wiring area is reduced, the space in which the cells can be placed is increased and the space in which the signal lines can be placed is also increased so that the degree of integration of the circuit is increased.

—Placement of Cells Below Trunk Voltage Supply Line—

The placement of the cells below the trunk power supply line (or the trunk ground line) can be performed easily in accordance with the following method.

For example, there can be considered a structure in which the trunk voltage supply line is provided in a wiring layer positioned above the element voltage supply lines with two or more layers interposed therebetween. It is possible to, e.g., provide vertical signals lines in a wiring layer located immediately under the wiring layer in which the trunk voltage supply line is provided and provide the element voltage supply lines and lateral signal lines in a wiring layer located thereunder. The signal lines for the cells can be provided by placing cells below the trunk voltage supply line.

However, the foregoing structure is disadvantageous in that the through-hole connecting terminals provided between the element voltage supply lines and the trunk voltage supply line present an obstacle to the placement of the lateral signal lines. Besides, the through-hole connecting terminals provided between the element voltage supply lines and the trunk voltage supply line also makes it difficult to reduce the width of each of the element voltage supply lines, which is effective in increasing the degree of integration of the groups of cells in future. To reduce an area required to provide connections between the element voltage supply lines and the trunk voltage supply line, it is necessary to form through-hole connecting terminals each having a diameter smaller than the width of the element voltage supply line. The resulting through-hole connecting terminals are extremely small in size compared with the other through-hole connecting terminals. It is extremely difficult to form such small through-hole connecting terminals.

From the foregoing, it can be understood that the element voltage supply lines and the trunk voltage supply line are formed advantageously in the same wiring layer. In the present embodiment, as shown in FIG. 1, the element power supply lines 2a are connected to the trunk power supply line 3a placed on one side of the cell rows and the element ground lines 2b are connected to the trunk ground line 3b placed on the other side of the cell rows. Since the element power supply lines 2a and the element ground lines 2b are connected to the trunk power supply line 3a and to the trunk ground line 3b on the left and right sides, respectively, it becomes possible to provide the lines (the element power supply lines and the element ground lines) of the cells and the trunk lines (the trunk power supply line and the trunk ground line) in the same wiring layer. With these lines provided in the same wiring layer, direct connections can be provided between the element power supply lines 2a and the trunk power supply line 3a and between the element ground lines 2b and the trunk ground line 3b. This obviates the necessity for the through-hole connecting terminals.

—Cross-Sectional Structure of Lines—

Figure 2:
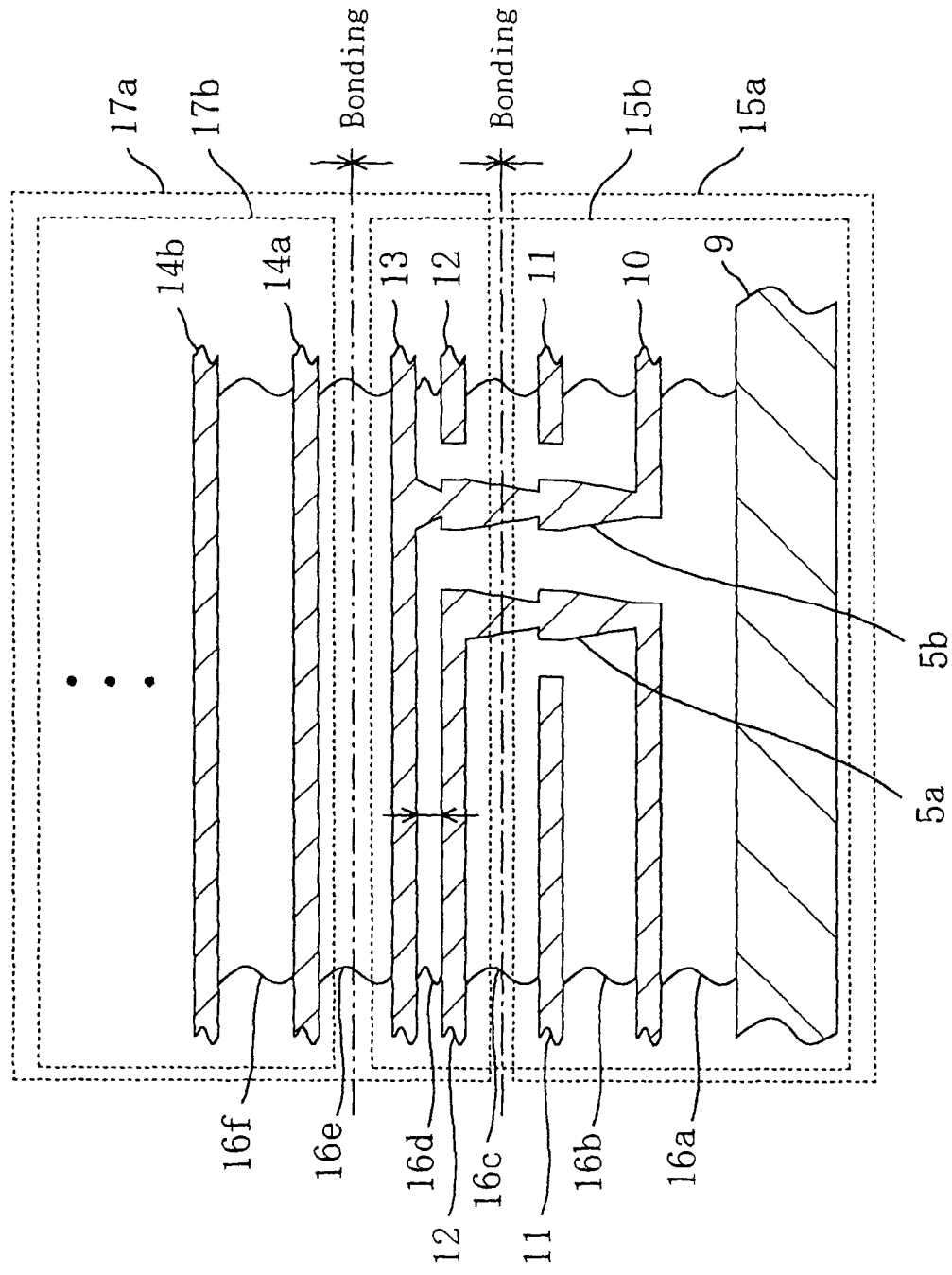
FIG. 2 is a cross-sectional view for illustrating a multilayer structure of the voltage supply lines and signal lines according to the embodiment.

FIG. 2 is a cross-sectional view showing a cross-sectional structure of the lines shown in FIG. 1. Although FIGS. 1 and 2 show the plan and multi-layered structures of the individual components, respectively, they do not show the positional relations among the individual components. For example, the positional relation between the through-hole connecting terminals 5a and 5b in FIG. 2 does not reflect the positional relation therebetween in FIG. 1. This is because the cross-sectional structure of FIG. 2 is shown schematically for the sake of clarity.

As shown in FIG. 2, a semiconductor layer 9 made of silicon or the like is formed with transistors composing the cells. First to fourth wiring layers 10, 11, 12, 13, 14a, and 14b are composed of conductive films made of aluminum, copper, and the like. Interlayer insulating films 16a to 16f composed of silicon dioxide films and the like are provided between the semiconductor layer 9 and the wiring layers 10, 11, 12, 13, 14a, and 14b to dielectrically insulate the semiconductor layer and the individual wiring layers.

The element power supply lines 2a, the element ground lines 2b, the trunk power supply line 3a, and the trunk ground line 3b shown in FIG. 1 are provided in the first wiring layer 10. The branch power supply lines 4a are provided in the third wiring layer 12, while the branch ground lines 4b are provided in the fourth wiring layer 13. The through-hole connecting terminal 5a shown in FIG. 1 extends through the two interlayer insulating films 16b and 16c to provide a connection between the first and third wiring layers 10 and 12. The through-hole connecting terminal 5b shown in FIG. 1 extends through the three interlayer insulating films 16b, 16c, and 16d to provide a connection between the first and fourth wiring layers 10 and 13. Even if a slight level difference exists in a certain wiring layer due to a so-called intermediate wiring layer, the intermediate wiring layer is considered to be contained in the wiring layer without making distinction therebetween. For example, the element power supply lines 2a of the cells and the trunk power supply line 3a are considered to be contained in the same wiring layer 10 irrespective of a slight level difference therebetween provided that direct connections which do not require through-hole connecting terminals are provided therebetween. The same shall apply to the element ground lines 2a and to the trunk ground line 3b.

Although the branch power supply lines 4a and the branch ground lines 4b are provided in the third and fourth wiring layers 12 and 13, respectively, they may be provided in the fourth and third wiring layers 13 and 12, respectively, by switching the vertical positions of the branch power supply lines 4a and the branch ground lines 4b.

Next, a description will be given to signal lines. For example, signal lines parallel with the element power supply lines 2a and the element ground lines 2b in the unit structure may be provided in the first wiring layer 10. Signal lines may also be provided in the second wiring layer 11. The second wiring layer is used primarily in the case where a signal line (short-distance signal line 6 shown in FIG. 1) having a relatively short distance between the input and output terminals thereof is provided. If the first and second wiring layers 10 and 11 are insufficient in terms of area as a region in which the short-distance signal lines 6 are placed, another wiring layer may also be provided between the second and third wiring layers 11 and 12. As an example of the short-distance signal line 6, a local line formed from tungsten or the like may be listed in addition to those provided in the first and second wiring layers 10 and 11. Since the local line can be placed below the first wiring layer 10, e.g., on the insulating film for element isolation or on the semiconductor substrate, the formation thereof is in no way restricted by the element power supply lines 2a, the element ground lines 2b, the trunk power supply line 3a, and the trunk ground line 3b. This makes it possible to use the local line.

Next, a description will be given to another approach to the placement of signal lines. There are cases where the transitions (toggling) of signals on signal lines should be measured in the process of fabricating a prototype of the semiconductor integrated circuit device. However, since signal lines provided in the second wiring layer 11 are covered with the branch power supply lines 4a and the branch ground lines 4b provided in the third and fourth wiring layers 12 and 13, respectively, a signal on the signal line provided in the second wiring layer 11 cannot be measured occasionally. To avoid the difficulty experienced in performing measurements, it is also possible to provide the signal lines in the fifth and sixth wiring layers 14a and 14b located above the third and fourth wiring layers 12 and 13, not in the second wiring layer 11. Since the signal lines thus placed are positioned above the branch power supply lines 4a and the branch ground lines 4b, various signals on the signal lines can be measured.

In another approach, a long-distance signal line 7 is provided in each of the fifth and sixth wiring layers 14a and 14b for a purpose other than avoiding the measurement difficulty. If there is, e.g., a signal line connecting the output terminal of a circuit and the input terminal of another circuit and if a comparison is made between a distance of connection provided therebetween by the signal line and a distance of connection provided between the semiconductor layer 9 and the fifth and sixth wiring layers 14a and 14b by the through-hole connecting terminals, the signal line connecting the two circuits can be defined as a long-distance signal line when the distance of connection provided between the two circuits is sufficiently larger than the distance of connection provided by the through-hole connecting terminal, while the other signal lines can be defined as short-distance signal lines. The long-distance signal line 7 shown in FIG. 1 is provided in each of the fifth and sixth wiring layers 14a and 14b. As examples of the long-distance signal line 7, there can be listed a so-called bus signal line for signal transmission between circuit blocks and a signal line for delivering a clock signal.

The time required for signal transmission varies depending on the size of a line because the capacitance and resistance contained in the line also vary depending on the size of the line.

As the signal line is longer, the signal transmission time is longer. Depending on whether or not delay time in the portion of the signal line corresponding to the through-hole connecting terminal should be eliminated for a shorter signal transmission time, signal lines can be classified as long-distance signal lines and short-distance signal lines. If the portion of the signal line corresponding to the through-hole connecting terminal is sufficiently shorter than the other portion thereof, increased delay time in the portion corresponding to the through-hole connecting terminal does not present a problem since it is extremely short compared with delay time in the entire signal line. Therefore, the signal line can be defined as a long-distance signal line. If the portion of the signal line corresponding to the through-hole connecting terminal is not sufficiently shorter than the other portion thereof, the signal line can be defined as a short-distance signal line. In the case of providing signal lines in the fifth and sixth wiring layers 14a and 14b, therefore, a long-distance signal line is provided preferably.

In still another approach, an area of the second wiring layer 11 available for signal lines is reduced since the through-hole connecting terminals 5a and 5b vertically extend through part of the second wiring layer 11. Since the second wiring layer 11 is divided by the through-hole connecting terminals 5a and 5b in FIG. 2, it can be seen that the region of the second wiring layer 11 shown in the cross-sectional view of FIG. 2 is unavailable for signal lines. In short, as a large number of wiring layers are provided between the first wiring layer 10 provided with the trunk power supply line 3a and the trunk ground line 3b and the third and fourth wiring layers 12 and 13 provided with the branch power supply lines 4a and with the branch ground lines 4b, the through hole connecting terminals 5a and 5b pass through a large number of wiring layers so that the area assigned to the through-hole connecting terminals 5a and 5b in each of the wiring layers is increased. In other words, a loss in the area available for signal lines is increased. It will be understood from FIG. 2 that the through-hole connecting terminal 5b dividing each of the second and third wiring layers 11 and 12 reduces the area available for signal lines. The through-hole connecting terminal 5a divides only the second wiring layer 11. To reduce the area reduction, it is preferable to place signal lines in the fifth and sixth wiring layers 14a and 14b located above the third and fourth wiring layers 12 and 13 or in a wiring layer provided below the third and fourth wiring layers 12 and 13 without providing a wiring layer between the first wiring layer 10 and the second and third wiring layers 11 and 12. The branch power supply lines 4a form paths for supplying currents from power supply pads to the groups of partitioned cells. At a maximum length, each of the branch power supply lines 4a extends from an edge of the semiconductor chip to the center thereof. Although the following description will be given to the power supply lines, the same shall apply to the ground lines. In addition, the currents consumed by all the circuits flow along the branch power supply lines 4a. Accordingly, it is necessary to reduce the wiring resistance and thereby suppress an amount of voltage drop in the line. If the wiring area is large, the wiring area may occupy half or more of the chip area. In that case, the branch power supply lines 4a and the branch ground lines 4b cannot be provided in the same wiring layers in which the trunk power supply line 3a and the trunk ground line 3b are provided, respectively. Since each of the branch power supply lines 4a and the branch ground lines 4b occupies a large wiring area, they are provided in a wiring layer located above the trunk power supply line 3a and the trunk ground line 3b. If the area of each of the branch power supply lines 4a and the branch ground lines 4b is particularly large, there are cases where the branch power supply lines 4a should be provided in a wiring layer different from the wiring layer provided with the branch ground lines 4b. In this case, the cells can be placed below the branch power supply lines 4a and the branch ground lines 4b by using a wiring layer (first wiring layer 10) having the element power supply lines 2a placed therein for an inter-cell signal line. If a wiring area required for each of the branch power supply lines 4a and the branch ground lines 4b is not so large for the reason that the total current consumed by the circuit is small or the like, they may be provided appropriately in the same wiring layer. If the area assigned to each of the branch power supply lines 4a and the branch ground lines 4b is insufficient for the reason that the total current consumed by the circuit is large or the like, the wiring area of each of the branch power supply lines 4a and the branch ground lines 4b may be increased by providing one or more additional wiring layers for the branch power supply lines 4a and the branch ground lines 4b or the like. For example, it can be considered that the branch power supply lines 4a and the branch ground lines 4b are provided in an A layer, while additional branch lines 4a to be connected to the branch power supply lines 4a are provided in a B layer and additional branch ground lines 4b to be connected to the branch ground lines 4b are provided in a C layer to increase the wiring area of each of the branch voltage supply lines.

To place a signal line over the element voltage supply lines, another wiring layer may be provided appropriately between the wiring layer in which the element voltage supply lines are placed and the wiring layer in which the branch voltage supply lines are placed. The wiring layer provided will be termed a signal wiring layer for cells. To provide the signal wiring layer for the cells, there can be adopted a method in which one layer of vertical signal lines and one layer of lateral signal lines are provided and a method in which vertical signal lines are provided in the second wiring layer 11 and lateral signal lines are provided in the first wiring layer 10 provided with the element power supply lines 2a. These methods are adopted selectively depending on a circuit to be designed in which a certain power supply line is provided or on another circuit to be merged therein in consideration of the degree of integration of each of the circuits. As a smaller number of wiring layers are provided for the signal lines of the cells, the sum of the areas occupied by the through-hole connecting terminal 5a for providing a connection between the branch power supply line 4a and the trunk power supply line 3a in the individual signal wiring layers for cells is reduced. As a result, the area available for signal lines is less likely to be reduced by the area occupied by the power supply lines.

There is also a method of placing the third wiring layer 12 in which the branch power supply lines 4a are placed and the fourth wiring layer 13 in which the branch ground lines 4b are placed such that they are adjacent to each other. By placing the third and fourth wiring layers 12 and 13 in overlapping relation, a relatively large capacitance can be formed between power supplies. The capacitance between power supplies may be considered as part of an important component of the voltage supply lines if it is provided to reduce electromagnetic interference noise. To effectively reduce electromagnetic interference noise, it is necessary to increase the capacitance per unit area of a capacitor formed between a power-supply wiring layer and a ground wiring layer. For this purpose, the interlayer insulating film 16d interposed between the third wiring layer 12 in which the branch power supply lines 4a are placed and the fourth wiring layer 13 in which the branch ground lines 4b are placed is preferably formed thin or from a dielectric material with a high dielectric constant. Needless to say, the capacitance is further increased if the interlayer insulating film 16d is formed thin from a dielectric material with a high dielectric constant. If the area of an overlapping portion between the lines on the power supply side and the lines on the ground side is increased, the capacitance of the capacitor is also increased.

Therefore, the branch power supply lines 4a and the branch ground lines 4b are alternately arranged with a given distance provided therebetween and connected to the trunk power supply line 3a and to the trunk ground line 3b, respectively, as shown in FIG. 1. The reason for thus placing the branch power supply lines 4a and the branch ground lines 4b is that, if the lines on the power supply side and the lines on the ground side are alternately arranged when the signal lines are provided above the branch power supply lines 4a, the region which allows the signal lines to pass therethrough can be increased compared to that in the positional relationship shown in FIG. 10. As the pairs of the branch power supply lines 108a and the branch ground lines 108b are placed with a given spacing provided therebetween in FIG. 10, the lines on the power supply side and the lines on the ground side should be placed with a given or more spacing provided therebetween such that they are not linked to each other. If the signal lines cannot pass through the given necessary spacing, however, the region cannot be used for the passage of the signal lines.

—Placement of Branch Power Supply Lines and Branch Ground Lines—

Figure 3:
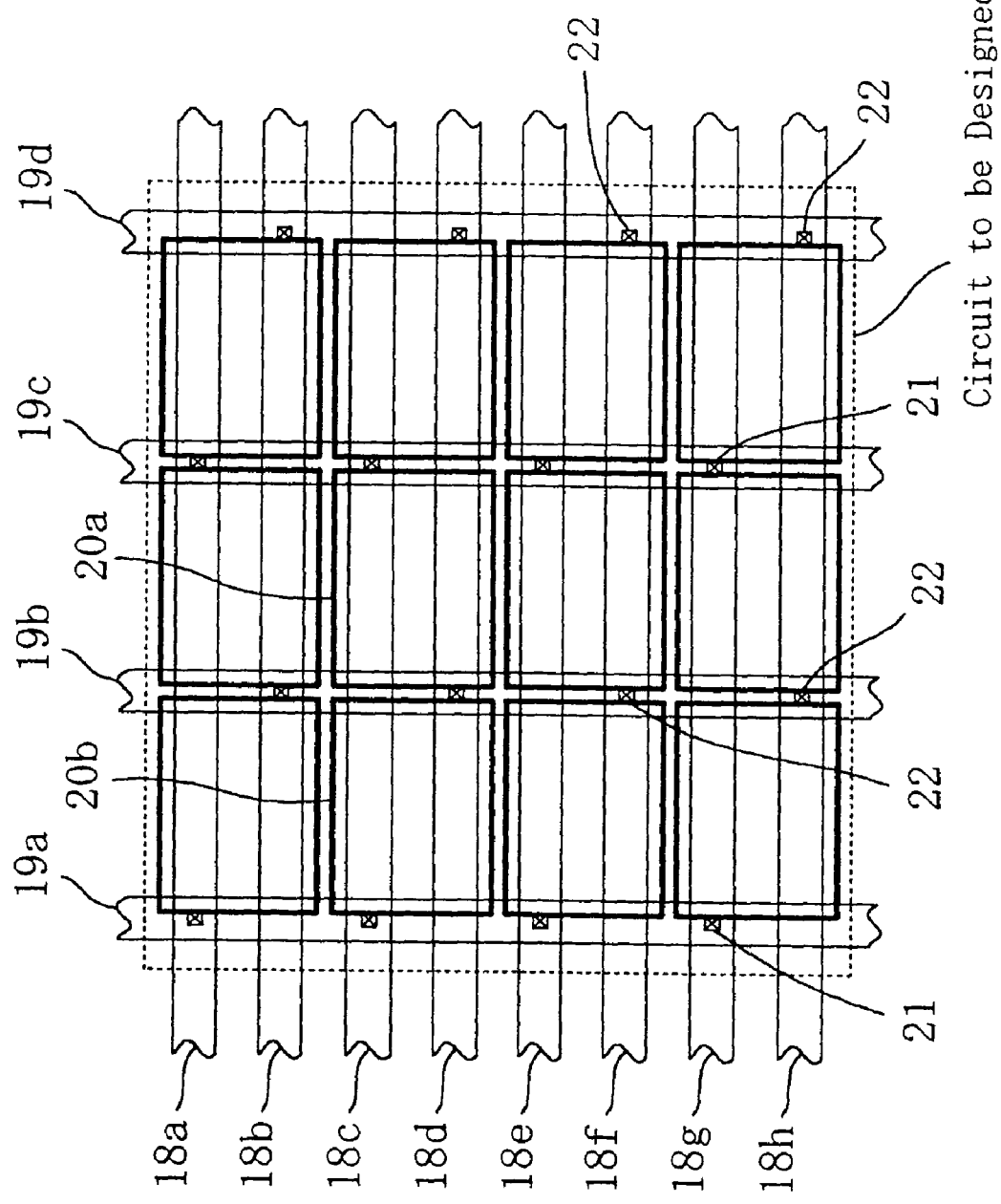
FIG. 3 is a plan view showing an example of the structures of branch power supply lines and branch ground lines according to the present invention, in which unit structures are arranged as a matrix.

FIG. 3 is a plan view showing an example of the positional relationship between the branch power supply lines and the branch ground lines when the unit structures are arranged as a matrix. FIG. 4 is a plan view showing an example of the positional relationship between the branch power supply lines and the branch ground lines when the unit structures are arranged in a staggered (checkered) pattern.

As shown in FIG. 3, the unit structures 20a and 20b are placed between the lateral lines 18a to 18h and the vertical lines 19a to 19d. In FIG. 3, the unit structures 20a and 20b each corresponding to the unit structure of the first structure are represented diagrammatically as the rectangles defined by the boldface lines. The through-hole connecting terminals 21 connecting the branch power supply lines and the trunk power supply lines to each other and the through-hole connecting terminals 22 connecting the branch ground lines and the trunk ground lines to each other are provided at the points of intersection of the vertical lines 19a to 19h and the lateral lines 18a to 18h. The lateral lines 18a, 18c, 18e, and 18g and the vertical lines 19a and 19c intersecting at the points where the through-hole connecting terminals 21 on the power supply side correspond to the branch power supply line 4a shown in FIG. 1. The lateral lines 18b, 18d, 18f, and 18h and the vertical lines 19b and 19d intersecting at the points where the through-hole connecting terminals 22 on the ground side correspond to the branch ground line 4b shown in FIG. 1. The through-hole connecting terminals 21 on the power supply side shown in FIG. 3 correspond to the through-hole connecting terminal 5a shown in FIG. 1. The through-hole connecting terminals 22 on the ground side shown in FIG. 3 correspond to the through-hole connecting terminal 5b shown in FIG. 1.

In the example shown in FIG. 3, the unit structures 20a and 20b are arranged as a matrix. In the unit structures 20a and 20b, the lines connecting the through-hole connecting terminals 21 on the power supply side to the through-hole connecting terminals 22 on the ground side extend in mutually intersecting relations. This is because the unit structures are arranged as a matrix.

In the example shown in FIG. 4, the unit structures 20a and 20a are arranged in alternate rows in a so-called staggered (checkered) pattern. Consequently, the lines connecting the through-hole connecting terminals 21 on the power supply side to the through-hole connecting terminals 22 on the ground side extend in parallel relation in the unit structures 20a and 20b.

In FIGS. 3 and 4, the trunk power supply lines for the individual unit structures 20a and 20b are placed below the vertical lines 19a and 19c as the branch power supply lines and the trunk ground lines for the individual unit structures 20a and 20b are placed below the vertical lines 19b and 19d as the branch ground lines, though they are not depicted.

Although the size of each of the cells, the width of each of the power supply lines, the size of each of the through-hole connecting terminals, and the scale of the circuits to be designed shown in FIG. 10 do not coincide with those shown in FIGS. 3 and 4, the circuit to be designed which is defined by the broken lines in each of FIGS. 3 and 4 is the same as the circuit to be designed which is defined by the broken lines in FIG. 10. In the structure shown in FIG. 10, the trunk power supply lines 107a and the branch power supply lines 108a are placed at the end portions of the circuit to be designed so that the power supply lines are designed for the whole circuit to be designed. In the structure shown in FIG. 3, by contrast, the through-hole connecting terminals 21 connecting the trunk power supply lines and the branch power supply lines are distributed as a matrix so that the circuit to be designed is composed of the unit structures as basic elements to which the groups of cells are assigned and which are arranged as a matrix. Although the unit structures are arranged in the staggered pattern in the structure shown in FIG. 4, the structures shown in FIGS. 3 and 4 are obtained under the same scheme of dividing the circuit to be designed into the unit structures.

When viewed in a plan view, a network of branch power supply lines and a network of branch ground lines are formed distinctly in each of the examples shown in FIGS. 3 and 4 so that the lines 18a, 18c, 18e, 18g, 19a, and 19c and the lines 18b, 18d, 18f, 18h, 19b, and 19d require individual wiring layers. If the branch power supply lines and the branch ground lines do not need a large area, however, the lines 18a to 18h can be provided in a single wiring layer by omitting the lines 19a to 19d.

—Bonded Structure—

To optimize the electrical characteristic such as impedance of a signal line or a voltage supply line and reduce delay time in the signal line and an amount of voltage drop in the voltage supply line in future, the technology of bonding a so-called micro substrate using another material to form signal lines and voltage supply lines in part of a semiconductor integrated circuit device or a substrate used only for wiring to the remaining part of the semiconductor integrated circuit device has been developed. The structures of the voltage supply lines and the signal lines thus far described are also compatible with the technology, which will be described herein below.

As indicated by the dash-dot lines in FIG. 2, the substrate is divided between the second and third wiring layers 11 and 12 so that the semiconductor layer 9, the interlayer insulating films 16a and 16b, the first and second wiring layers 10 and 11, and the lowermost portions of the through-hole connecting terminals 5a and 5b are provided in a semiconductor integrated circuit 15a, while the third to sixth wiring layers 12, 13, 14a, and 14b, the interlayer insulating films 16d to 16f, and the upper portions of the through-hole connecting terminals 5a and 5b are provided in a micro substrate 17a. The connections between the lowermost portions of the divided through-hole connecting terminals 5a and 5b and the upper portions thereof and the connections between the lines included in the semiconductor integrate circuit 15a and the lines included in the micro substrate 17a are provided by bonding the semiconductor integrated circuit 15a and the micro substrate 17a to each other. The connection between the trunk power supply line 3a and the branch power supply line 4a is provided by aligning the upper portions of the through-hole connecting terminals 5a with respect to the lowermost portions thereof and connecting the semiconductor integrated circuit 15a to the micro substrate 17a. If the number of the through-hole connecting terminals between the trunk voltage supply lines and the branch voltage supply lines is smaller than the number of the through-hole connecting terminals between the element voltage supply lines and the trunk voltage supply lines, a smaller number of connecting terminals are used than when the connection is provided by bonding the element voltage supply lines and the trunk voltage supply lines to each other. The same shall apply to the lines on the ground side.

As indicated by the two-dot chain line in FIG. 2, the substrate is divided between the fourth and fifth wiring layers 13 and 14a so that the semiconductor layer 9, the interlayer insulating films 16a to 16d, the first to fourth wiring layers 10 to 13, and the through-hole connecting terminals 5a and 5b are provided in the semiconductor integrated circuit 15b, while the fifth and sixth wiring layers 14a and 14b and the interlayer insulating film 16f are provided in the micro substrate 17b. The connections between the lines contained in the semiconductor integrated circuit 15b and the lines contained in the micro substrate 17b are provided by bonding the semiconductor integrated circuit 15b and the micro substrate 17b to each other. In the structure, the connections between the individual voltage supply lines are provided in the semiconductor integrate circuit 15b so that the number of connecting terminals between the semiconductor integrated circuit 15b and the micro substrate 17b is reduced.

—Testing of Connection in Bonded Structure—

In a semiconductor integrated circuit device having a structure which provides electrical connections between the terminals of a semiconductor integrated circuit and the terminals of a micro substrate by bonding the semiconductor integrated circuit and the micro substrate to each other, it is necessary to test whether or not normal connections are provided between the respective connecting portions of the terminals. The connecting states of the signal lines can be tested by determining whether or not the circuit performs a function predicted in design. The following is the difference between the testing of the connecting states of the voltage supply lines and the testing of the connecting states of the signal lines. Since a plurality of connecting terminals are provided between the trunk voltage supply lines and the branch voltage supply lines, if at least one of the plurality of connecting terminals is connected in a dc fashion, a current flows between the branch voltage supply lines and the trunk voltage supply lines even though the other connecting terminals are not connected so that an operating current is supplied to each of the cells. However, if connecting terminals actually formed include one which should be connected in design but is not in a connecting state, wiring resistance increases to increase an amount of voltage drop in the cell. Moreover, the number of current paths is reduced so that current densities increase at the connecting terminals and in the trunk power supply line. If a semiconductor element operates at a high speed, the circuit may undergo a faulty operation. Furthermore, electromigration at the connecting terminals and in the voltage supply lines cannot positively be suppressed any more. As a result, the power supply line may be disconnected by electromigration after a lapse of several years so that the semiconductor integrated circuit that has operated up to the disconnection do not operate any more.

Figure 7:
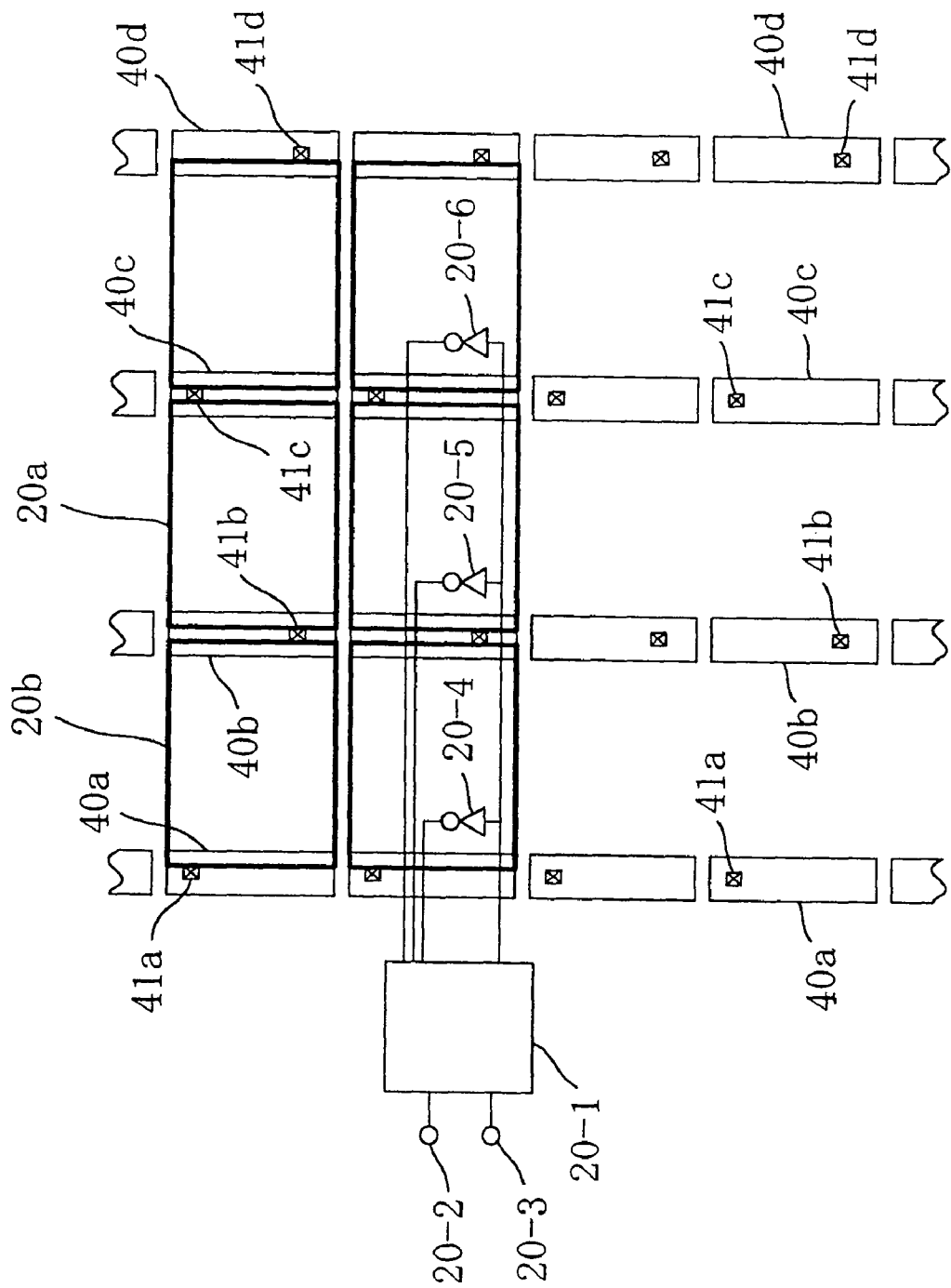
FIG. 7 is a block circuit diagram showing the case where the power supply lines shown in FIGS. 1 to 3 have a structure which allows the testing of connecting states at through-hole connecting terminals.

FIG. 7 is a plan view illustrating a method for testing the connecting state in each of the unit structures. To allows the testing of the connecting states at the connecting terminals, the testing method divides the trunk voltage supply lines in a dc fashion.

As shown in FIG. 7, respective connecting terminals 41a to 41d are provided between the divided trunk voltage supply lines 40a to 40d and the divided voltage supply lines (not shown). There are also provided test circuits 20-4, 20-5, and 20-6, a control circuit 20-1 for controlling the test circuits 20-4, 20-5, and 20-6, an input terminal 20-2 for supplying a signal to the control circuit 20-1, and an output terminal 20-3 for fetching a signal from the control circuit 20-1.

The trunk voltage supply lines 40a and 40b shown in FIG. 7 correspond to the trunk power supply lines (not shown) placed in the wiring layer underlying the vertical branch power supply lines 19a and 19c shown in FIGS. 3 and 4. The trunk voltage supply lines 40b and 40d shown in FIG. 7 correspond to the trunk ground lines (not shown) placed in the wiring layer underlying the vertical branch ground lines 19b and 19d shown in FIGS. 3 and 4. Respective connecting terminals 41a and 41c are provided on the trunk voltage supply lines 40a and 40b in a one-to-one relationship, whereby the trunk voltage supply lines 40a and 40b are connected to the respective branch voltage supply lines. Respective connecting terminals 41b and 41d are provided on the trunk voltage supply lines 40b and 40d in a one-to-one relationship, whereby the trunk voltage supply lines 40b and 40d are connected to the respective branch ground lines.

In the structure shown in FIG. 7, the unit structures are arranged as a matrix, similarly to those shown in FIG. 3. Although the unit structures 20a and 20b are placed only in the upper part of FIG. 7 for the sake of clarity, similar unit structures are placed also in the lower part of FIG. 7. By contrast to the structures shown in FIGS. 1 and 3 in which the trunk power supply line and the trunk ground line are provided continuously in the vertical directions, the trunk voltage supply lines 40a and 40c (trunk power supply line) and the trunk voltage supply lines 40b and 40d (trunk ground line) in the structure shown in FIG. 7 are separated on a per unit-structure basis. In FIG. 1, the separation lines corresponding to the boundary lines of the unit structures in FIG. 7 are indicated by the dotted lines. If one of the power supply terminals is unconnected, the cell using the trunk voltage supply line 40a or 40c having the unconnected power supply terminal as a current supply path will not operate. It will therefore be understood that the testing of whether or not the connecting terminals include unconnected one can be performed by checking the function of the circuit. By determining the position at which a circuit portion causing circuit maloperation is located, the unconnected connecting terminal can be specified.

The connecting terminal in an unconnected state can be specified easily by providing the respective separated trunk voltage supply lines with the testing circuits 20-4, 20-5, and 20-6 having respective inverters for testing whether or not the circuits themselves operate, outputting the results of operations of the testing circuits 20-4, 20-5, and 20-6, and associating the circuits outputting non-transitive signals with the connecting terminals, as shown in FIG. 7. The inverters 20-4 to 20-6 shown in FIG. 7 are connected to the respective element power supply lines and element ground lines of the unit structures in which they are contained. In FIG. 7, the element power supply lines and the element ground liens are not depicted. The signals inputted to the respective test circuits 20-4 to 20-6 and the signals outputted therefrom are detected by the control circuit 20-1 in response to an instruction signal transmitted from the input terminal 20-2. The output signals from the test circuits 20-4 to 20-6 are detected so that the results reflecting the operating states of the respective test circuits are outputted from the output terminals 20-3. If the instruction signal is inputted from the input terminal 20-2 to the control circuit 20-1, signals of which the logic levels are transitive are transmitted from the control circuit 20-1 to the testing circuits 20-4 to 20-6. The signals also cause changes in the output signals from the test circuits 20-4 to 20-6. The changes in the output signals are recognized by the control circuit 20-1. If all the voltage supply lines to be examined are connected normally, the output signals from all the test circuits shift. On the other hand, if the connecting terminal of the power supply line in the leftmost unit structure in the drawing is in the unconnected state, the output signal from the test circuit 20-4 does not shift. Thus, the connecting terminal in the unconnected state is specified depending on whether or not the output signal sifts and the result is outputted from the output terminal 20-3.

Figure 8:
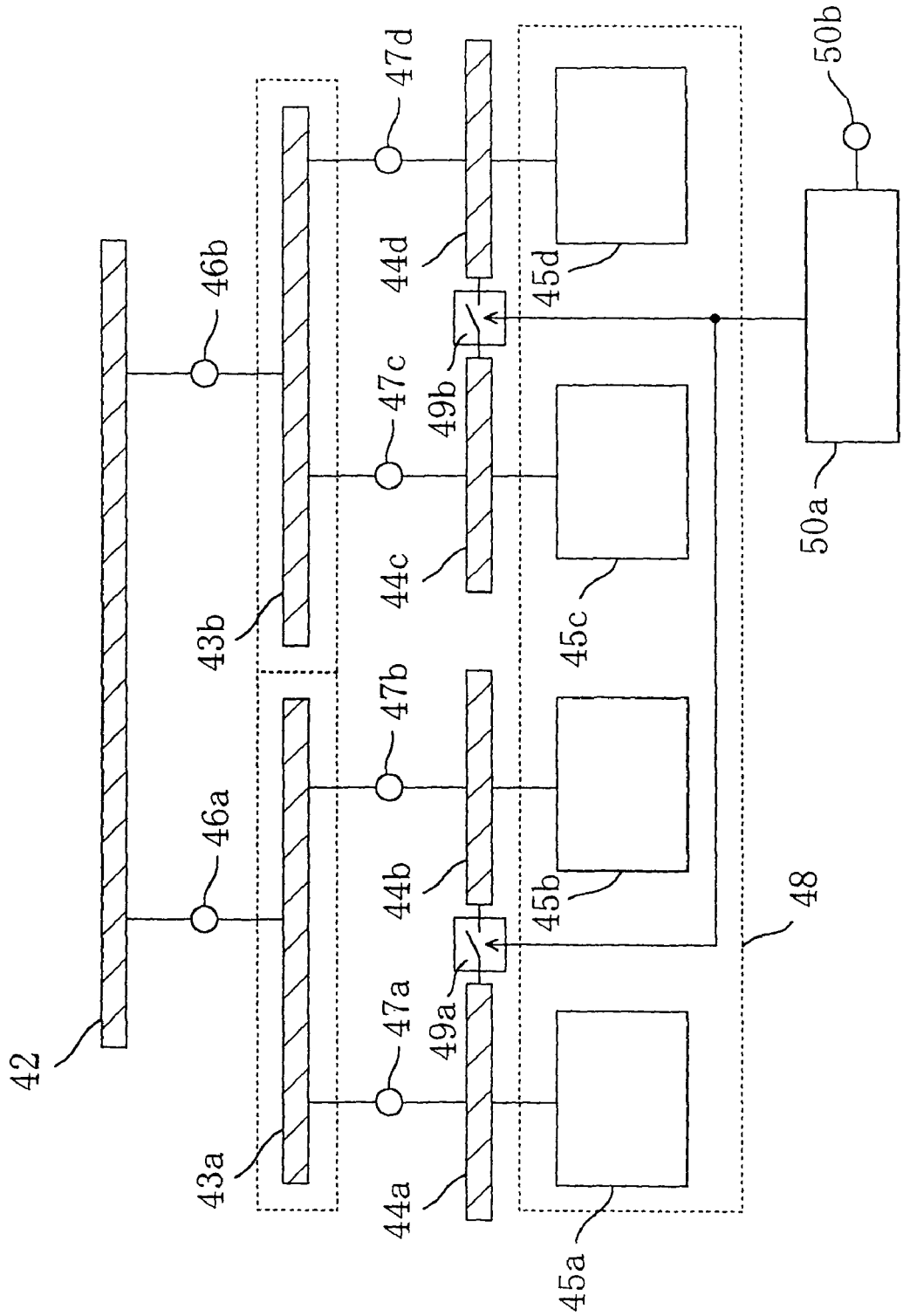
FIG. 8 is a block circuit diagram showing a fundamental structure of the power supply lines which allows the testing of the connecting states at the connecting terminals of the power supply lines.

FIG. 8 is a plan view showing a basic structure of the voltage supply lines. In the drawing, 42, 43a, 43b, and 44a to 44d denote the voltage supply lines, 46a, 46b, and 47a to 47d denote connecting terminals, 45a to 45d denote circuits, and 48 denotes a portion including partial circuits 45a to 45d to have one function. Compared with the voltage supply wiring structure thus far described, the voltage supply line 42 is a voltage supply line external of the semiconductor integrated circuit, which is a lead if the use of a plastic package is assumed. The voltage supply terminals 46a, 46b, and 47a to 47d, the voltage supply lines 43a, 43b, and 44a to 44d, and the circuits 45a to 45d are located within the semiconductor integrated circuit device. The connecting terminals 46a and 46b are provided between voltage supply pads and the voltage supply line 42, which are wires if the use of the plastic package is assumed. The voltage supply lines 43a and 43b are branch voltage supply lines and the voltage supply lines 44a to 44d are trunk voltage supply lines. The circuits 45a to 45d contain the element voltage supply lines. The circuit 48 corresponds to the circuit to be designed, which is defined by the broken lines in FIGS. 3 and 4.

During the operation of the circuits, a current flows therein from the voltage supply line 42. The current is distributed to the voltage supply lines 43a and 43b via the connecting terminals 46a and 46b. The current is further distributed from the voltage supply line 43a to the voltage supply lines 44a and 44b via the connecting terminals 47a and 47b to enter each of the circuits 45a and 45b. The same shall apply to the other current paths. An important point in the present structure is that the current is distributed in a tree configuration and one connecting terminal is provided between the upstream voltage supply line and the downstream voltage supply line at each of the distributed points. The provision of one connecting terminal indicates that, if the connecting terminal is brought into an unconnected state, a design problem occurs in the voltage supply lines. For example, if a connecting point is composed of a plurality of connecting terminals, the design problem occurs if some of the connecting terminals composing the connecting point are in the unconnected state and a current density in the voltage supply line or at another connecting terminal exceeds a permissible design value.

Thus, in the structure shown in FIG. 8 in which the voltage supply line 42 and the connecting terminals 46a and 46b are placed externally of the semiconductor chip and the branch voltage supply lines 43a and 43b are placed internally of the semiconductor chip, the branch voltage supply lines 43a and 43b are connected to the voltage supply line 42 via the respective connecting terminals 47a to 47d. On the other hand, the branch voltage supply lines 43a and 43b are separated from each other to form paths supplying distributary currents from the connecting terminals 46a and 46b to the connecting terminals in the unit structures within the semiconductor chip. Although the voltage supply pads (not shown) are connected to the branch voltage supply lines 43a and 43b, it is assumed that they are contained in the branch voltage supply lines 43a and 43b.

In the following cases, however, it is inappropriate to divide the branch voltage supply line as shown in FIGS. 7 and 8. For example, there are cases where the voltage supply pads are placed on the periphery of the semiconductor chip and current paths should be provided at different portions of the semiconductor chip. In these cases, the branch voltage supply lines inevitably overlap each other due to the voltage supply wiring structure. This may cause the situation in which the portion which should be separated cannot be separated. To divide the branch voltage supply line, a new wiring layer for the branch voltage supply line is provided disadvantageously. In the case where an increase in wiring area in not allowable, the branch voltage supply line cannot be divided at all. The division may cause an excessively large increase in the resistance of the branch voltage supply line.

If the voltage supply pads can be placed not only on the peripheral portion of the semiconductor chip but also in the semiconductor chip, i.e., if voltage supply pads termed area pads are used, the foregoing problems are less likely to occur due to the placement of the voltage supply pads in the chip so that the branch voltage supply line is divided easily. As a result, the connecting states at the connecting terminals 46a and 46b can be tested. For example, if a semiconductor integrated circuit is attached to a chip-sized package (so-called C-CSP) made of ceramic, the connecting terminals 46a and 46b function as connecting portions (e.g., micro bumps or the like) for providing connections between the voltage supply lines 42 of the C-CSP and the voltage supply pads on the branch voltage supply lines 43a and 43b. The connecting states at the connecting portions can be tested easily.

The approach to the testing of connections is applicable not only to the structure of voltage supply lines shown in FIGS. 1 and 2 but also to another structure of voltage supply lines. In a structure in which a semiconductor integrated circuit device and a micro substrate are connected to each other, e.g., if element voltage supply lines are provided in the semiconductor integrated circuit device, trunk voltage supply lines are provided in the micro substrate, and the element voltage supply lines and the trunk voltage supply lines are connected to each other by bonding the semiconductor integrated circuit device and the micro substrate to each other, one connecting terminal may be provided appropriately on each of the element voltage supply lines. In that case, a cell using the element voltage supply line having an unconnected connecting terminal as a current supply path does not operate, similarly to the foregoing case, so that testing is allows by checking the functions of circuits. It will easily be appreciated that the unconnected portion can be specified from the position at which an unfunctioning circuit is placed. In this case, a larger number of connecting terminals than used in the foregoing case are used to provide connections between the element voltage supply lines and the trunk voltage supply lines in bonding the semiconductor integrated circuit device and the micro substrate to each other. As a larger number of connecting terminals are used, the probability of an unconnected terminal is higher. If the provision of the trunk voltage supply lines in a wiring layer other than that provided with the element voltage supply lines allows the cells to be placed under the trunk voltage supply lines, however, the number of cells that can be placed is increased advantageously. It will easily be appreciated that the trunk voltage supply line and the branch voltage supply lines can be provided in the same wiring layer.

The method for testing connection can be used not only to test the connection between the semiconductor integrated circuit device and the micro substrate but also to examine whether or not a through-hole connecting terminal between voltage supply lines is connected in a semiconductor integrated circuit device. Although the testing of the through-hole connecting terminal requires the separation of the voltage supply lines 44a to 44d, it is sufficient for the voltage supply lines 44a to 44d to be separated from each other only during the test period. The voltage supply lines 44a to 44d may also be connected to each other during the other period, e.g., during an actually operating period. By providing, e.g., switches 49a and 49b between the individual voltage supply lines as shown in FIG. 8, it is possible to separate the voltage supply lines 44a and 44b from each other and the voltage supply lines 44c and 44d from each other during the test period and connect the voltage supply lines 44a and 44b to each other and the voltage supply lines 44c and 44d to each other during the other period. The switches 49a and 49b are closed during the test period and are opened during the other period. The opening and closing operations are performed by the control circuit 50a. A signal for determining whether or not testing should be performed is inputted from the terminal 50b.

In the foregoing description, it is assumed that each of the divided trunk voltage supply lines has one through-hole connecting terminal. However, each of the divided trunk voltage supply lines may include a plurality of through-hole connecting terminals provided that one of the plurality of through-hole connecting terminals included in the divided trunk voltage supply line is connected appropriately in design. The same shall apply to the testing of the connections between the element voltage supply lines and the trunk voltage supply lines. The same shall also apply to the case where one connecting terminal is provided for the connection between one branch voltage supply line and the external substrate of a semiconductor integrated circuit. Although the description has been given thus far to the voltage supply lines, the same shall apply to the ground lines.

—Method for Forming Wiring Structure—

Figure 9:
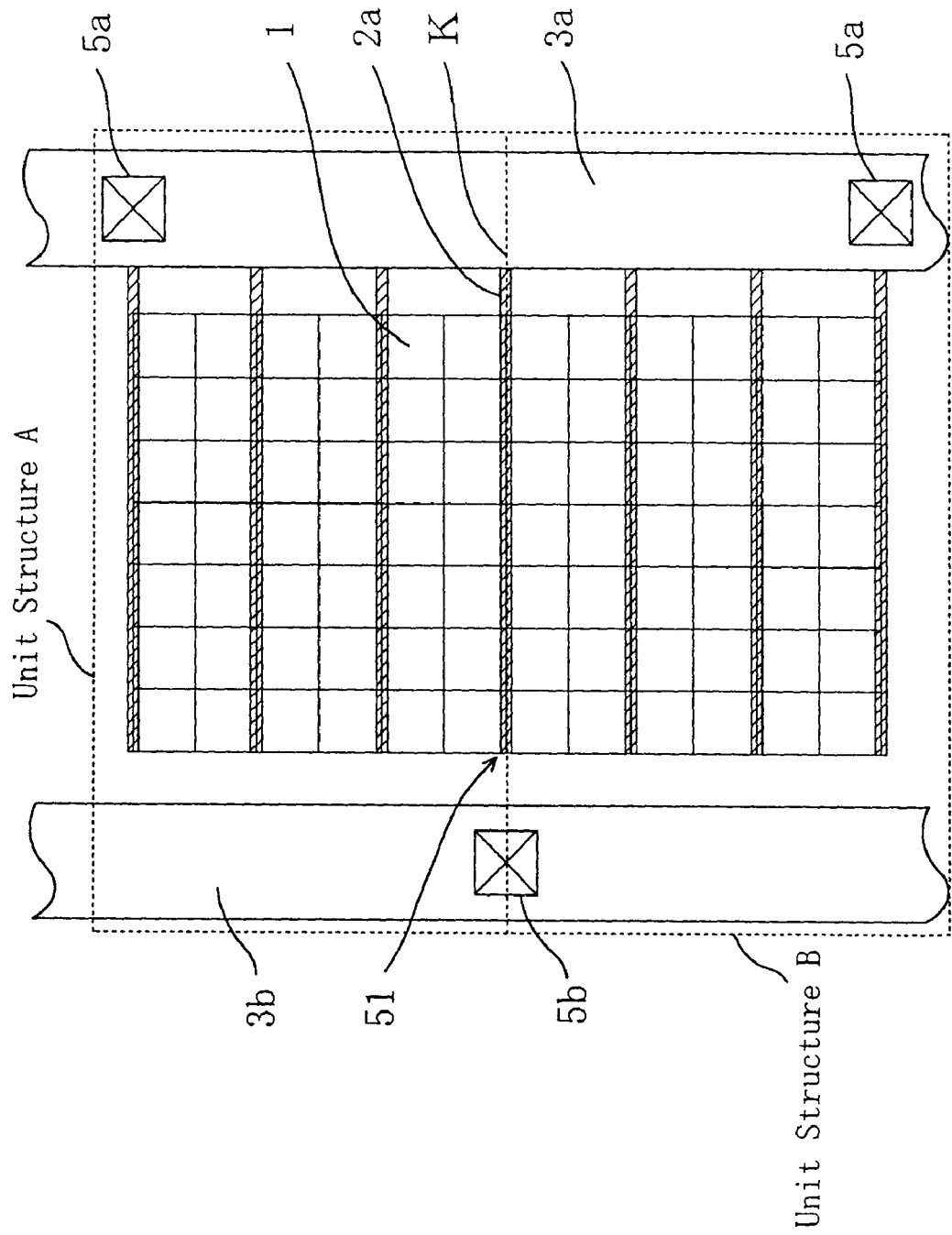
FIG. 9 is a plan view for providing a wiring structure curve in the unit structure of FIG. 1 by calculation.

FIG. 9 is a plan view for illustrating a method for forming a wiring structure in accordance with the flow chart of FIG. 6. The description will be given herein below to a method for determining a wiring structure by using calculation equations different from the equations (1) to (5) already described.

Although the structure of voltage supply lines shown in FIG. 9 is the same as the structure of voltage supply lines shown in FIG. 1, they are on different scales for simpler drawings. In FIG. 9, the element ground lines are not depicted. The description of the components shown in FIG. 9 which are the same as those shown in FIG. 1 will be omitted by retaining the same reference numerals.

In FIG. 9, the unit structures A and B adjacent to each other are arranged in the vertical direction. In FIG. 9, 51 denotes a point at which the amount of voltage drop is maximum in the unit structure A. Here, the equation for calculating the amount Vd of voltage drop at the maximum voltage drop point 51 is to be determined (corresponding to Steps ST13, ST11, and ST12 shown in FIG. 6). The upper through-hole connecting terminal 5a and the lower through-hole connecting terminal 5a are assumed to be fixed at the same voltage. The element power supply line 2a of the cell having the maximum voltage drop point 51 is assumed to be located midway between the two through-hole connecting terminals 5a.

The amount Vc of voltage drop between each of the through-hole connecting terminals 5a on both ends of the trunk power supply line 3a and the center point K is given by the following equation (6):

$$Vc = (1/2) \times (1/2) \times (Ic) \times (Rc) \quad (6)$$

where Ic is the total current consumed in the unit structures A and B, Rc is a resistance between the through-hole connecting terminals on both ends of the trunk power supply line 3a. Because the through-hole connecting terminals 5a, i.e., constant voltage points are present on both ends, the amount of voltage drop at the center point K is half the product of the current Ic and the resistance Rc. It is further assumed the element power supply lines 2a of the unit structures A and B are evenly connected between the through-hole connecting terminals 5a on both ends of the trunk power supply line 3a and that an equal current flows into each of the element power supply lines 2a. If consideration is given to the conclusion drawn approximately from the equation (5) that the amount Vd of voltage drop is halved, the amount Vd of voltage drop becomes half the half value of the product of the current Ic and the resistance Rc. The amount Vcc of voltage drop in the element power supply line 2a located at the center of the drawing is given by the following equation (7):

$$Vcc = 1/2 \times (Icc) \times (Rcc) \quad (7)$$
$$= 1/2 \times \{Ic/(2M)\} \times (Rcc)$$

where Icc is the total current consumed by the cells connected to the element power supply line at the center and Rcc is a resistance of the element power supply line at the center. If the total current consumed by the cells is assumed to be evenly distributed to each of the element power supply lines 2a, the amount Vdd of voltage drop determined approximately from the equation (6) becomes half the product of the total consumed current Icc and the resistance Rcc in the same manner as described above. If it is assumed approximately that the current Ic in the unit structures A and B is evenly distributed to each of the cell rows, the total consumed current Icc becomes a value obtained by dividing the current Ic by the number 2M of cell rows present in each of the unit structures A and B, which is given by Icc=Ic/(2M) where M is the number of cell rows in each of the unit structures A and B. Since the maximum amount Vd of voltage drop is the sum of Vc and Vcc, the following equation (8) is derived from the equations (6) and (7):

$$Vd = Vc + Vcc \quad (8)$$
$$= (1/4) \times (Ic) \times (Rc) + (1/2) \times \{Ic/(2M)\} \times (Rcc)$$
$$= [(1/2) \times \{(Rc) + (Rcc/M)\}] \times (Ic/2)$$

where the first term $[(1/2) \times \{(Rc)+(Rcc/M)\}]$ on the right side of the equation (8) is a value associated with the unit structure. For example, the values Rc and Rcc increase when the area of the unit structure increases, while the ratio between the vertical and lateral sizes of the unit structure is held constant, and the line has a constant width. Conversely, the values Rc and Rcc decrease when the area of the unit structure decreases. This is because, when the area of the unit structure increases, the branch power supply line 3a is elongated and therefore the element power supply line is also elongated. On the other hand, the second term (Ic/2) of the equation (8) represents a current consumed in one unit structure. If it is assumed that a proportional relationship is established between the area Sb of the unit structure and $[(1/2) \times \{(Rc)+(Rcc/M)\}]$, the following equation (9) is derived from the equation (8):

$$Vd = \{(a) \times (Sb)\} \times (Ib) \quad (9)$$

where Ib=Ic/2 is satisfied. This confirms that each of the product of the area Sb of the unit structure and a constant a of proportionality and the consumed current Ib is in inversely proportional relation with the amount Vd of voltage drop. That is, the area Sb of the unit structure and the consumed current Ib are in approximately inversely proportional relation with the amount Vd of voltage drop. From the equation (2), a circuit characteristic equation obtained from the total area Sbb of the groups of cells composing a circuit to be designed and the total consumed current Ibb is determined to be Sb=(Sbb/Ibb)×(Ib) (which corresponds to Step ST14). From the value and the equation (9), the following equations (10) and (11) are derived:

$$Sb = \sqrt{\{(Sbb) \times (Vd)/a/Ibb\}} \quad (10)$$

$$Ib = \sqrt{\{(Ibb) \times (Vd)/a/Sbb\}} \quad (11)$$

(which correspond to Steps ST15 and ST16).

Thus, the area Sb of the unit structure and the total current Ib consumed therein can be determined appropriately.

According to the present invention, there can be provided an integrated circuit device and a method for forming lines which allows miniaturization and easy testing of connecting states by properly placing the element voltage supply lines, the trunk voltage supply line, and the branch voltage supply line, while preventing increases in the area of the circuit and in the amount of voltage drop.

What is claimed is:

1. An integrated circuit device having a circuit portion including a plurality of electronic elements, the circuit portion being formed of a plurality of cells, the device comprising:
   a plurality of first element voltage supply lines connected to a higher potential terminal of each of the plurality of the cells;
   a plurality of second element voltage supply lines connected to a lower potential terminal of each of the plurality of the cells;
   a first trunk voltage supply line connected to each of the plurality of first element voltage supply lines;
   a second trunk voltage supply line connected to each of the plurality of second element voltage supply lines;
   a first branch voltage supply line connected to the first trunk voltage supply line to supply a voltage from the outside to the first trunk voltage supply line;
   a second branch voltage supply line connected to the second trunk voltage supply line to supply a voltage from the outside to the second trunk voltage supply line;
   a first wiring layer provided above the plurality of the cells to have the first and second element voltage supply lines and the first and second trunk voltage supply lines placed therein; and
   at least one upper wiring layer provided above the first wiring layer to have the first and second branch voltage supply lines placed therein, wherein:
   the plurality of first element voltage supply lines and the plurality of second element voltage supply lines extend in a first direction,
   the first and second trunk voltage supply lines and the first and second branch voltage supply lines extend in a second direction,
   the first trunk voltage supply line and the first branch voltage supply lines are provided to overlap and are connected to each other by a plurality of connecting terminals, and
   the second trunk voltage supply line and the second branch voltage supply line are provided to overlap and are connected to each other by a plurality of connecting terminals.

2. The device of claim 1, wherein the at least one upper wiring layer includes a second wiring layer and a third wiring layer provided above the second wiring layer.

3. The device of claim 2, further comprising
   a first chip and a second chip, wherein
   the third wiring layer is provided in the second chip,
   the third wiring layer includes the first and second branch voltage supply lines, and
   the first and second element voltage supply lines and the first and second trunk voltage supply lines in the first wiring layer and the first and second branch voltage supply lines in the third wiring layer are connected to each other by bonding the first and second chips to each other.

4. The device of claim 3, wherein the second chip serves as a substrate used only for wiring.

5. The device of claim 3, wherein the second chip serves as a micro substrate.

6. The device of claim 5, wherein the first chip and the second chip are attached to each other with a micro bump.

7. The device of claim 1, further comprising
   a first chip and a second chip, wherein
   the plurality of the cells and the first wiring layer are provided in the first chip, the first branch voltage supply line is provided in the second chip, and the first trunk voltage supply line and the first branch voltage supply line are connected to each other by bonding the first and second chips to each other.

8. The device of claim 7, wherein the second chip serves as a substrate used only for wiring.

9. The device of claim 7, wherein the second chip serves as a micro substrate.

10. The device of claim 9, wherein the first chip and the second chip are attached to each other with a micro bump.

11. The device of claim 1, further comprising:
a first chip and a second chip, wherein
the plurality of the cells and the first wiring layer are provided in the first chip,
the second branch voltage supply line is provided in the second chip, and
the second trunk voltage supply line and the second branch voltage supply line are connected to each other by bonding the first and second chips to each other.

12. The device of claim 11, wherein the second chip serves as a substrate used only for wiring.

13. The device of claim 11, wherein the second chip serves as a micro substrate.

14. The device of claim 11, wherein the first chip and the second chip are attached to each other with a micro bump.

15. The device of claim 1, further comprising:
first and second connecting terminals each provided at a connecting point between the first trunk voltage supply line and the first branch voltage supply line, wherein
the first and second connecting terminals are disposed in spaced apart relation with a given distance or more therebetween.

16. The device of claim 1, further comprising:
first and second connecting terminals each provided at a connecting point between the second trunk voltage supply line and the second branch voltage supply line, wherein
the first and second connecting terminals are disposed in spaced apart relation with a given distance or more therebetween.

17. The device of claim 1, wherein the first direction is perpendicular to the second direction.

18. The device of claim 1, wherein:
the first branch voltage supply line includes a first line extending in the first direction and a second line extending in the second direction, and
the first trunk voltage supply line and the second line of the first branch voltage supply line are provided to overlap and are connected to by the plurality of connecting terminals.

19. An integrated circuit device having a circuit portion including a plurality of electronic elements, the circuit portion being formed of a plurality of cells, the device comprising:
a plurality of first element voltage supply lines connected to a higher potential terminal of each of the plurality of the cells;
a plurality of second element voltage supply lines connected to a lower potential terminal of each of the plurality of the cells;
a first trunk voltage supply line connected to each of the plurality of first element voltage supply lines;
a second trunk voltage supply line connected to each of the plurality of second element voltage supply lines;
a first branch voltage supply line connected to the first trunk voltage supply line to supply a voltage from the outside to the first trunk voltage supply line;
a second branch voltage supply line connected to the second trunk voltage supply line to supply a voltage from the outside to the second trunk voltage supply line;
a first wiring layer provided above the plurality of the cells to have the first and second element voltage supply lines and the first and second trunk voltage supply lines placed therein;
at least one upper wiring layer provided above the first wiring layer to have the first and second branch voltage supply lines placed therein, and
a first chip and a second chip, wherein:
the at least one upper wiring layer includes a second wiring layer and a third wiring layer provided above the second wiring layer,
the third wiring layer is provided in the second chip,
the third wiring layer has the first and second branch voltage supply lines, and
the first and second element voltage supply lines and the first and second trunk voltage supply lines in the first wiring layer and the first and second branch voltage supply lines in the third wiring layer are connected to each other by bonding the first and second chips to each other.

20. The device of claim 19, wherein the second chip serves as a substrate used only for wiring.

21. The device of claim 19, wherein the second chip serves as a micro substrate.

22. The device of claim 21, wherein the first chip and the second chip are attached to each other with a micro bump.

23. An integrated circuit device having a circuit portion including a plurality of electronic elements, the circuit portion being formed of a plurality of cells, the device comprising:
a plurality of first element voltage supply lines connected to a higher potential terminal of each of the plurality of the cells;
a plurality of second element voltage supply lines connected to a lower potential terminal of each of the plurality of the cells;
a first trunk voltage supply line connected to each of the plurality of first element voltage supply lines;
a second trunk voltage supply line connected to each of the plurality of second element voltage supply lines;
a first branch voltage supply line connected to the first trunk voltage supply line to supply a voltage from the outside to the first trunk voltage supply line;
a second branch voltage supply line connected to the second trunk voltage supply line to supply a voltage from the outside to the second trunk voltage supply line;
a first wiring layer provided above the plurality of the cells to have the first and second element voltage supply lines and the first and second trunk voltage supply lines placed therein;
at least one upper wiring layer provided above the first wiring layer to have the first and second branch voltage supply lines placed therein; and
a first chip and a second chip, wherein:
the plurality of the cells and the first wiring layer are provided in the first chip, the first branch voltage supply line is provided in the second chip, and
the first trunk voltage supply line and the first branch voltage supply line are connected to each other by bonding the first and second chips to each other.

24. The device of claim 23, wherein the second chip serves as a substrate used only for wiring.

25. The device of claim 23, wherein the second chip serves as a micro substrate.

26. The device of claim 25, wherein the first chip and the second chip are attached to each other with a micro bump.

27. An integrated circuit device having a circuit portion including a plurality of electronic elements, the circuit portion being formed of a plurality of cells, the device comprising:
- a plurality of first element voltage supply lines connected to a higher potential terminal of each of the plurality of the cells;
- a plurality of second element voltage supply lines connected to a lower potential terminal of each of the plurality of the cells;
- a first trunk voltage supply line connected to each of the plurality of first element voltage supply lines;
- a second trunk voltage supply line connected to each of the plurality of second element voltage supply lines;
- a first branch voltage supply line connected to the first trunk voltage supply line to supply a voltage from the outside to the first trunk voltage supply line;
- a second branch voltage supply line connected to the second trunk voltage supply line to supply a voltage from the outside to the second trunk voltage supply line;
- a first wiring layer provided above the plurality of the cells to have the first and second element voltage supply lines and the first and second trunk voltage supply lines placed therein;
- at least one upper wiring layer provided above the first wiring layer to have the first and second branch voltage supply lines placed therein, and
- a first chip and a second chip, wherein:
- the plurality of the cells and the first wiring layer are provided in the first chip,
- the second branch voltage supply line is provided in the second chip, and
- the second trunk voltage supply line and the second branch voltage supply line are connected to each other by bonding the first and second chips to each other.

28. The device of claim 27, wherein the second chip serves as a substrate used only for wiring.

29. The device of claim 27, wherein the second chip serves as a micro substrate.

30. The device of claim 27, wherein the first chip and the second chip are attached to each other with a micro bump.

* * * * *